United States Patent
Feilchenfeld et al.

(10) Patent No.: US 7,956,412 B2
(45) Date of Patent: Jun. 7, 2011

(54) LATERAL DIFFUSION FIELD EFFECT TRANSISTOR WITH A TRENCH FIELD PLATE

(75) Inventors: Natalie B. Feilchenfeld, Jericho, VT (US); Jeffrey P. Gambino, Westford, VT (US); Louis D. Lanzerotti, Burlington, VT (US); Benjamin T. Voegeli, Burlington, VT (US); Steven H. Voldman, South Burlington, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 11/950,001

(22) Filed: Dec. 4, 2007

(65) Prior Publication Data

US 2009/0140343 A1    Jun. 4, 2009

(51) Int. Cl.
*H01L 29/417* (2006.01)
(52) U.S. Cl. ........ 257/343; 257/296; 257/301; 257/304; 257/305; 257/335; 257/342; 257/E29.256; 257/E29.261; 438/454
(58) Field of Classification Search .................. 257/367, 257/E29.256, 296, 301, 304, 305, 335, 342, 257/343, E29.261; 438/289, 454
See application file for complete search history.

(56) References Cited

U.S. PATENT DOCUMENTS

| | | | | |
|---|---|---|---|---|
| 5,200,354 A | * | 4/1993 | Om et al. | 438/243 |
| 6,445,019 B2 | * | 9/2002 | Van Dalen | 257/217 |
| 7,067,870 B2 | * | 6/2006 | Omura et al. | 257/302 |
| 7,473,976 B2 | * | 1/2009 | Kocon | 257/408 |
| 2006/0118852 A1 | * | 6/2006 | Rueb | 257/301 |

OTHER PUBLICATIONS

Ludikhuize, A.W., "High-Voltage DMOS and PMOS in Analog IC's," IEDM 1982, pp. 81-84.

* cited by examiner

*Primary Examiner* — Matthew E Warren
*Assistant Examiner* — John Lin
(74) *Attorney, Agent, or Firm* — Scully, Scott, Murphy & Presser, P.C.; Richard Kotulak, Esq.

(57) ABSTRACT

A dielectric material layer is formed on a bottom surface and sidewalls of a trench in a semiconductor substrate. The silicon oxide layer forms a drift region dielectric on which a field plate is formed. Shallow trench isolation may be formed prior to formation of the drift region dielectric, or may be formed utilizing the same processing steps as the formation of the drift region dielectric. A gate dielectric layer is formed on exposed semiconductor surfaces and a gate conductor layer is formed on the gate dielectric layer and the drift region dielectric. The field plate may be electrically tied to the gate electrode, may be an independent electrode having an external bias, or may be a floating electrode. The field plate biases the drift region to enhance performance and extend allowable operating voltage of a lateral diffusion field effect transistor during operation.

14 Claims, 29 Drawing Sheets

LATERAL DIFFUSION FIELD EFFECT TRANSISTOR WITH A TRENCH FIELD PLATE

FIELD OF THE INVENTION

The present invention relates to semiconductor structures, and particularly to lateral diffusion metal-oxide-semiconductor field effect transistors (LDMOSFETs) having a trench field plate electrode and methods of manufacturing the same.

BACKGROUND OF THE INVENTION

A lateral diffusion metal-oxide-semiconductor field effect transistor (LDMOSFET) is a field effect transistor having a drift region between a gate and a drain region in order to avoid a high electric field at a drain junction, i.e., at the p-n junction between a body and the drain region. An LDMOSFET is typically employed in high voltage power applications involving voltages in the range from about 5 V to about 500 V, which is applied across the drain region and the source region. A substantial fraction of the high voltage may be consumed within the drift region in the LDMOSFET so that the electric field generated across the gate dielectric does not cause breakdown of the gate dielectric.

Referring to FIG. 1, a prior art LDMOSFET structure is shown, which comprises a body 31 having a doping of a first conductivity type and laterally abutting a drift region 41 having a doping of a second conductivity type, which is the opposite of the first conductivity type. The portions of the body 31 and the drift region 41 near the interface between them are herein referred to proximal ends since they are in proximity to the interface. The portions on the opposite ends are herein referred to distal ends. A source region 51 and the drain region 61, each having a heavy doping of the second conductivity type, are formed at a distal end of the body 31, and at a distal end of the drift region 41, respectively. A gate dielectric 71 and a gate electrode 81 are formed straddling the body 31 and the drift region 41 directly above the proximal ends of the body 31 and the drift region 41. A sufficient physical distance is provided for carrier diffusion between the interface and the drain region 61 for attenuating the electric field within the drift region either by providing shallow trench isolation 20 directly above the drift region 41 or by providing a sufficient length for the drift region 41 without forming shallow trench isolation thereabove. In case the shallow trench isolation 20 is employed above the drift region 41, the length of carrier diffusion across the drift region 41 is at least equal to the sum of the depth of the shallow trench isolation 20 directly above the drift region 41, the lateral width of the shallow trench isolation 20 directly above the drift region 41, and the difference between the depth of the shallow trench isolation 20 directly above the drift region 41 and the depth of the drain region 61. As such, in the case that shallow trench isolation 20 is present, the lateral distance between the body region 31 and the drain region 61 can be reduced, while achieving the same effective length of the drift region 41 compared to the case without a shallow trench isolation 20. Thus, the presence of shallow trench isolation 20 allows for a reduction in the area consumed by the transistor compared to the case without a shallow trench isolation 20. The drift region 41 is not directly externally biased. Four terminals, i.e., the body region 31, the source region 51, the drain region 61, and the gate electrode 81, are biased in the prior art LDMOSFET structure during operation. Oftentimes, the substrate region 10 has the same conductivity type doping as, and may be biased at the same voltage as, the body region 31. Generally, the tub region 11 has the same conductivity type doping, and is electrically connected to, the drain region 61.

Referring to FIG. 2, another prior art LDMOSFET structure disclosed by A. W. Ludikhuize, "High-Voltage DMOS and PMOS in Analog IC's," IEDM 1982, pp. 81-84, comprises a gate dielectric 72 having multiple thicknesses. The body 32, which has a doping of a first conductivity type, laterally abuts the drift region 42, which has a doping of the second conductivity type, at an interface directly below the gate dielectric 72. The gate dielectric 72 has stepwise increases in thickness in the direction from an edge of a gate electrode 82 over the body 32 toward an edge of the gate electrode 82 over the drift region 42. A source region 52 and a drain region 62 are formed in distal ends of the body 32 and the drift region 42, respectively. The stepwise increase in the thickness of the gate dielectric 72 reduces electric field across the gate dielectric 72 near the edge of the gate electrode 82 over the drift region 42. The reduction in the electric field is beneficial to the integrity of the gate dielectric 72, especially in an off-state when a high voltage is applied across the portion of the gate dielectric 72 directly below the edge of the gate electrode 82 and over the drift region 42.

The portion of the gate electrode 82 which is over the drift region 42 is generally referred to as a "field plate." While this example depicts the field plate as a portion of the gate electrode 82, it is sometimes formed as a distinct region which can be biased independently, but is generally biased at the same potential as the gate or source. In the case that the LDMOSFET is an n-type device, in an off-state, the gate electrode 82 and the source 52 are generally at approximately the same potential as the body 32, while the drain 62 is at a higher potential. An electric field exists laterally across the drift region 42, with the highest potential at the distal end near the drain 62, and the lowest magnitude potential at the proximal end near the body 32. An electric field also exists across the junction between drift region 42 and body 32. The electric field between gate electrode 82 and the drift region 42 causes an increased depletion of majority carriers in the drift region 42 below the gate electrode 82. This serves to reduce the electric field near the surface at the interface between the drift region 42 and the body 32, thereby increasing the effective breakdown voltage of the junction. For this reason, this type of device is termed "reduced surface field metal-oxide-semiconductor field effect transistor," or RESURF MOSFET.

In the present example, when the device is on, the gate electrode 82 is generally at a higher potential than the source 52 and the body 32, while the potential of the drain 62 is often at approximately the same potential as the source 52 and the body 32. In this case, the resulting electric field between the gate electrode 82 and the drift region 42 causes an accumulation of majority carriers in the drift region 42, thus reducing the effective resistance of the drift region in the on-state, or "on-resistance." As such, the addition of a field plate by extending the gate electrode over the drift region 42 provides a device which has an increased breakdown voltage between the body 32 and the drift region 42, yet has reduced on-resistance.

Typically, in order to minimize the electric field in the off-state of an LDMOSFET, the drift region is lightly doped and thus has a high resistance. However, the high resistance is undesirable in an on-state since the performance and efficiency is limited by the high resistance of the drift region. Reduction of on-resistance of the drift region generally comes at the expense of decreased breakdown voltage and device reliability, thus limiting the allowable operating voltage. Increase of resistance of the drift region results in an increase in the operating voltage at the expense of reduced performance and efficiency. One proposed solution involves the addition of a field plate over the drift region of the device. However, the prior art field plate is of limited usefulness in the case in which shallow trench isolation is employed. In such a case, the field plate would have to be positioned over the shallow trench isolation. However, the thickness of the shallow trench isolation would typically be too great to provide good capacitive coupling between the field plate and the underlying drift region, thereby limiting the effectiveness of the field plate to modulate carrier concentrations within the drift region. As such, the reduced LDMOSFET device area associated with the addition of shallow trench isolation cannot be realized with the prior art field plate.

Therefore, there exists a need for an LDMOSFET structure providing both a low on-resistance and a high operating voltage within a small device area, and methods of manufacturing the same.

Specifically, there exists a need for an LDMOSFET structure having a field plate to modulate the surface field and resistance of a drift region and shallow trench isolation to allow reduced device area, and methods of manufacturing the same.

SUMMARY OF THE INVENTION

The present invention addresses the needs described above by providing an LDMOSFET structure having a trench field plate and methods of manufacturing the same.

A dielectric material layer is formed on a bottom surface and sidewalls of a trench in a semiconductor substrate. The silicon oxide layer forms a drift region dielectric on which a field plate is formed. Shallow trench isolation may be formed prior to formation of the drift region dielectric, or may be formed utilizing the same processing steps as the formation of the drift region dielectric. A gate dielectric layer is formed on exposed semiconductor surfaces and a gate conductor layer is formed on the gate dielectric layer and the drift region dielectric. The field plate may be electrically tied to the gate electrode, may be an independent electrode having an external bias, or may be a floating electrode. The field plate capacitively couples to the drift region to enhance performance and increase the allowable operating voltage of a lateral diffusion field effect transistor during operation.

The dielectric material layer may comprise a semiconductor oxide such as silicon oxide or any of high-k dielectric materials having a dielectric constant greater than 3.9.

The field plate is a conductive plate formed in the shallow trench over the drift region, and affects the drift region by attracting or repelling charge carriers to the portion of the drift region directly underneath the drift region dielectric. Thus, the conductivity and the electric field within drift region is modulated by the field plate.

In one embodiment, the field plate is integrally formed with a gate electrode of the inventive LDMOSFET. When the device is tuned on, i.e., when the gate potential is high for an n-type LDMOSFET or low for a p-type LDMOSFET, the field plate is biased to attract the charge carriers in the drift region, thus effectively reducing the resistance of the drift region by increasing the number of charge carriers, i.e., electrons or holes. When the device is turned off, i.e., when the gate potential is low for an n-type LDMOSFET or high for a p-type LDMOSFET, carriers are depleted from the drift region, thereby effectively increasing the resistance of the drift region and reducing the off-current further.

In another embodiment, the field plate is disjoined from the gate electrode and is buried within a shallow trench. A contact via is formed to the field plate. The field plate may be independently biased to enhance performance of the inventive LDMOSFET, or may be electrically tied to the gate electrode.

In yet another embodiment, the field plate that is disjoined from the gate electrode and buried within the shallow trench is not contacted by a contact via, but electrically floats. A field plate cap comprising a dielectric material provides a capacitive coupling between the gate electrode and the field plate. The field plate is thus biased indirectly by the gate electrode through the capacitive coupling, which enhances conductance of the drift region during an on-state and effectively increases the resistance of the drift region during an off state.

According to an aspect of the present invention, a semiconductor structure is provided, which comprises:

a trench located in a semiconductor substrate and containing at least one trench sidewall and a trench bottom surface;

a body having a doping of a first conductivity type and located in the semiconductor substrate;

a drift region having a doping of a second conductivity type and bounded by the at least one trench sidewall and the trench bottom surface, wherein the second conductivity type is the opposite of the first conductivity type;

a drift region dielectric of unitary construction comprising a dielectric material, located directly on and inside of the trench, and containing a bottom dielectric portion vertically abutting the trench bottom surface and a sidewall dielectric portion laterally abutting the at least one trench sidewall; and a gate electrode abutting the gate dielectric and the bottom dielectric portion.

In one embodiment, the semiconductor structure further comprises:

a source region having a doping of the second conductivity type, located in the semiconductor substrate, abutting the body, and disjoined from the drift region; and a drain region having a doping of the second conductivity type, located in the semiconductor substrate, abutting the drift region, and disjoined from the body.

In another embodiment, the semiconductor structure further comprises a gate spacer laterally abutting the gate electrode, wherein the source region is self-aligned to an edge of the gate electrode with an offset and the drain region is self-aligned to one of the at least one trench sidewall.

In even another embodiment, the at least one trench sidewall extends from a top surface of the semiconductor substrate to a depth into the semiconductor substrate and the trench bottom surface is located at the depth and adjoins the at least one trench sidewall, and wherein the entirety of the trench bottom surface and the at least one trench sidewall directly contacts the drift region dielectric, and wherein a top surface of the bottom dielectric portion is recessed from the top surface of the semiconductor substrate.

In yet another embodiment, the silicon oxide comprises thermal silicon oxide.

According to another aspect of the present invention, another semiconductor structure is provided, which comprises:

a trench located in a semiconductor substrate and containing at least one trench sidewall and a trench bottom surface;

a body having a doping of a first conductivity type and located in the semiconductor substrate;

a drift region having a doping of a second conductivity type and bounded by the at least one sidewall and the trench bottom surface, wherein the second conductivity type is the opposite of the first conductivity type;

a drift region dielectric of unitary construction comprising a dielectric material, located directly on and inside of the trench, and containing a bottom dielectric portion vertically abutting the trench bottom surface and a sidewall dielectric portion laterally abutting the at least one trench sidewall;

a gate electrode abutting the gate dielectric; and a field plate located within the trench, vertically abutting the bottom dielectric portion, and disjoined from the gate electrode.

In one embodiment, the semiconductor structure further comprises a field plate cap comprising a dielectric material and abutting the gate electrode and the field plate.

In another embodiment, a top surface of the field plate cap is substantially coplanar with a top surface of the semiconductor substrate.

In even another embodiment, the semiconductor structure further comprises a contact via vertically abutting the field plate and electrically isolated from the gate electrode.

In yet another embodiment, the semiconductor structure further comprises a field plate which is electrically floating and is capacitively coupled to the gate electrode.

In still another embodiment, the semiconductor structure further comprises:

a source region having a doping of the second conductivity type, located in the semiconductor substrate, abutting the body, and disjoined from the drift region; and a drain region having a doping of the second conductivity type, located in the semiconductor substrate, abutting the drift region, and disjoined from the body.

According to yet another aspect of the present invention, a method of forming a semiconductor structure is provided, which comprises:

forming a trench having at least one trench sidewall and a trench bottom surface in a semiconductor substrate;

forming a drift region dielectric of unitary construction comprising a dielectric material and containing a bottom dielectric portion vertically abutting the trench bottom surface and a sidewall dielectric portion laterally abutting the at least one trench sidewall;

forming a body having a doping of a first conductivity type and disjoined from the trench in the semiconductor substrate;

forming a drift region having a doping a second conductivity type, abutting the at least one trench sidewall and the trench bottom surface, and laterally abutting the body at an interface extending to a top surface of the semiconductor substrate;

forming a gate dielectric on the body and the drift region, wherein the gate dielectric directly contacts the drift region dielectric; and forming a gate electrode abutting the gate dielectric and the bottom dielectric portion.

In one embodiment, the method further comprises:

forming another trench in the semiconductor substrate at the same processing step as the forming of the trench;

forming shallow trench isolation comprising another dielectric material in the trench and the another trench; and removing the another dielectric material in the trench to expose the trench bottom surface and the at least one trench sidewall, while preserving the another dielectric material in the another trench prior to the forming of the drift region dielectric.

According to still another aspect of the present invention, another method of forming a semiconductor structure is provided, which comprises:

forming a trench having at least one trench sidewall and a trench bottom surface in a semiconductor substrate;

forming a drift region dielectric of unitary construction comprising a dielectric material and containing a bottom dielectric portion vertically abutting the trench bottom surface and a sidewall dielectric portion laterally abutting the at least one trench sidewall;

depositing a conductive material directly on the bottom dielectric portion and recessing the conductive material beneath a top surface of the semiconductor substrate to form a field plate;

forming a body having a doping of a first conductivity type and disjoined from the trench in the semiconductor substrate;

forming a drift region having a doping a second conductivity type, abutting the at least one trench sidewall and the trench bottom surface, and laterally abutting the body at an interface extending to a top surface of the semiconductor substrate;

forming a gate dielectric on the body and the drift region, wherein the gate dielectric directly contacts the drift region dielectric; and forming a gate electrode abutting the gate dielectric and the bottom dielectric portion.

In one embodiment, the method further comprises forming a drift field plate cap comprising another dielectric material directly on the field plate, wherein the field plate cap abuts the gate electrode after formation of the gate electrode.

In yet another embodiment, the method further comprises:

forming another trench in the semiconductor substrate at the same processing step as the forming of the trench;

depositing the dielectric material in the another trench at the same processing step as the forming of the drift region dielectric;

depositing the another dielectric material in the another trench after the recessing of the conductive material to form shallow trench isolation; and planarizing the another dielectric material over the trench to form the field plate cap.

In still another embodiment, the method further comprises:

forming another trench in the semiconductor substrate at the same processing step as the forming of the trench;

depositing the dielectric material in the another trench at the same processing step as the forming of the drift region dielectric;

depositing the another dielectric material in the another trench to form shallow trench isolation; and planarizing the conductive material over the trench prior to the recessing of the conductive material, wherein the conductive material is a doped silicon containing material and the field plate cap comprises thermal silicon oxide.

DETAILED DESCRIPTION OF THE INVENTION

Figure 1:
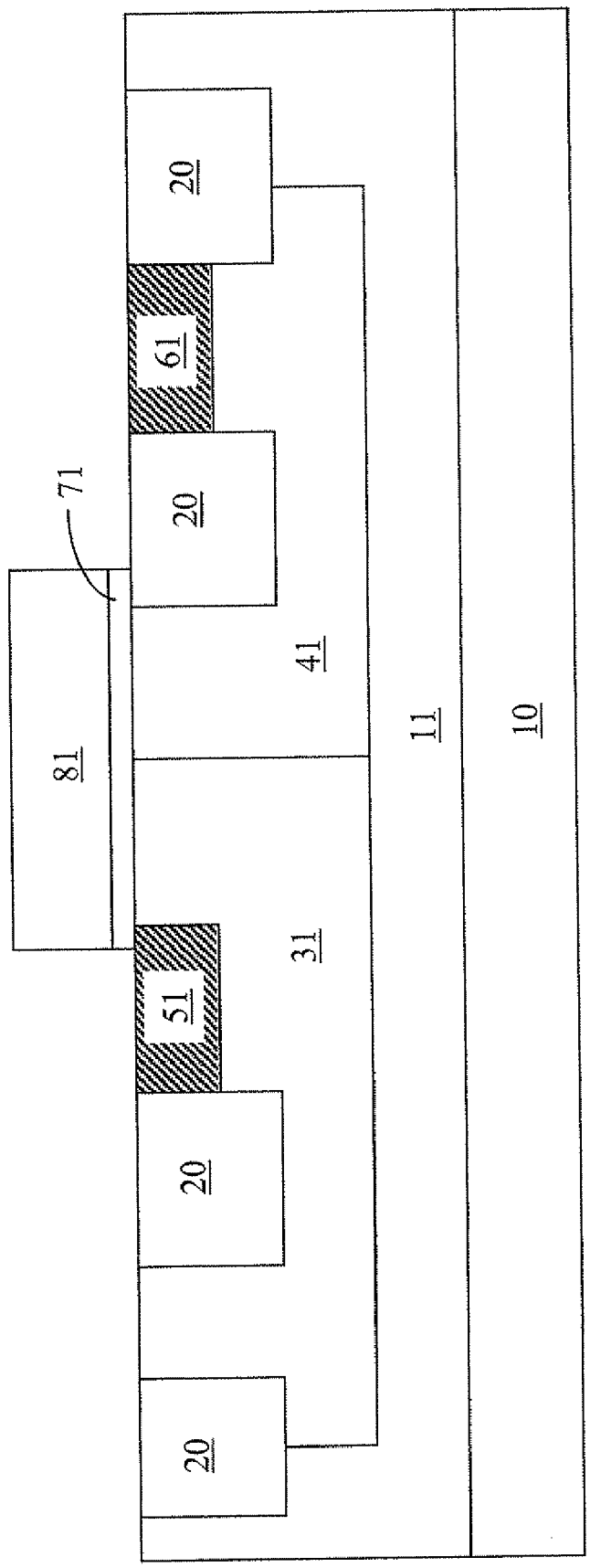
FIG. 1 is a vertical cross-sectional view of a prior art lateral diffusion metal-oxide-semiconductor field effect transistor (LDMOSFET) employing shallow trench isolation to provide an extended drift length in a diffusion region.
Figure 2:
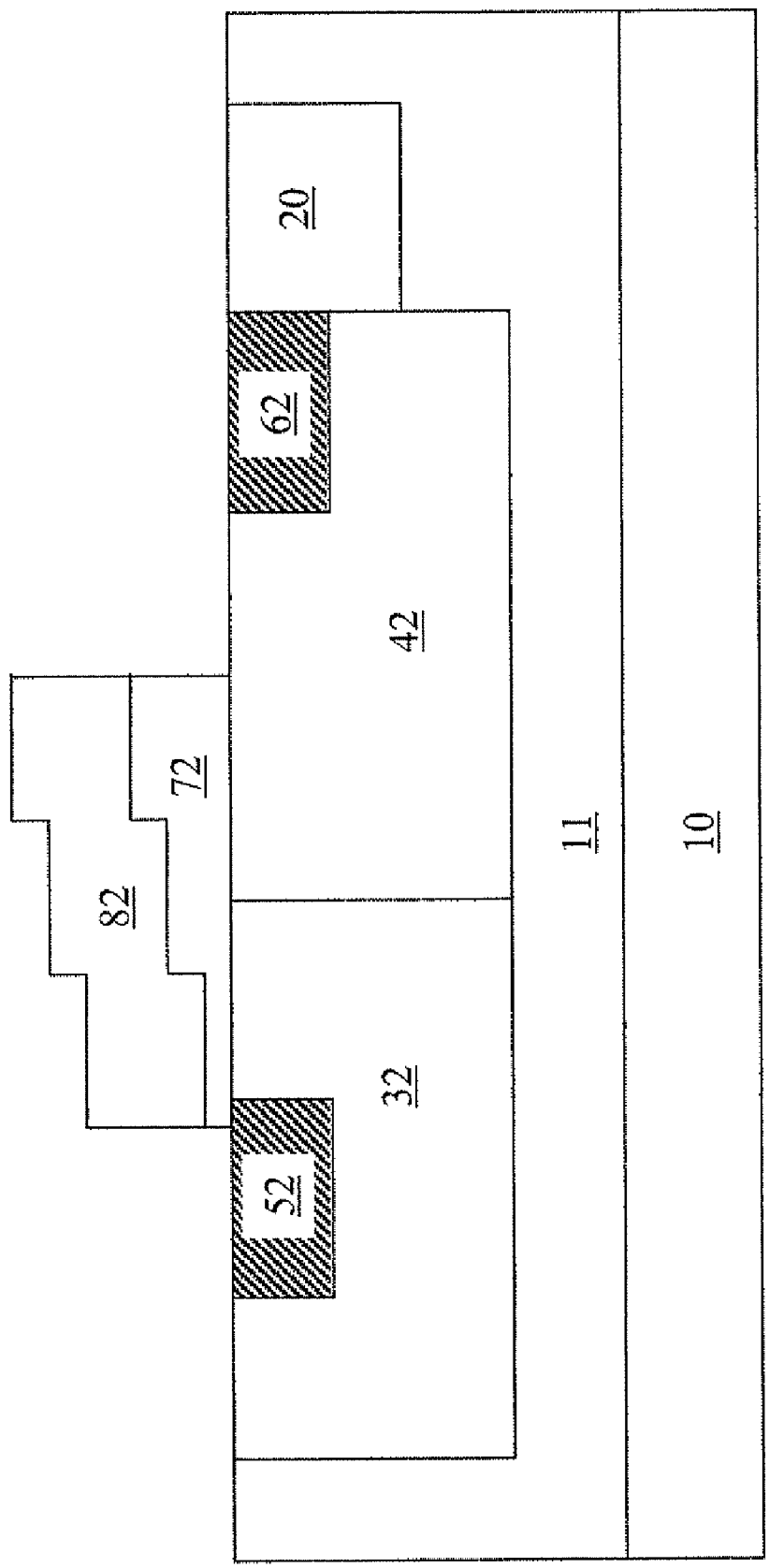
FIG. 2 is a vertical cross-sectional view of a prior art reduced surface field metal-oxide-semiconductor field effect transistor, which is a type of a LDMOSFET, in which a gate dielectric having stepwise changes in thickness is employed.

As stated above, the present invention relates to lateral diffusion metal-oxide-semiconductor field effect transistors (LDMOSFETs) having a field plate and methods of manufacturing the same, which are now described in detail with accompanying figures. It is noted that like and corresponding elements are referred to by like reference numerals.

Figure 3:
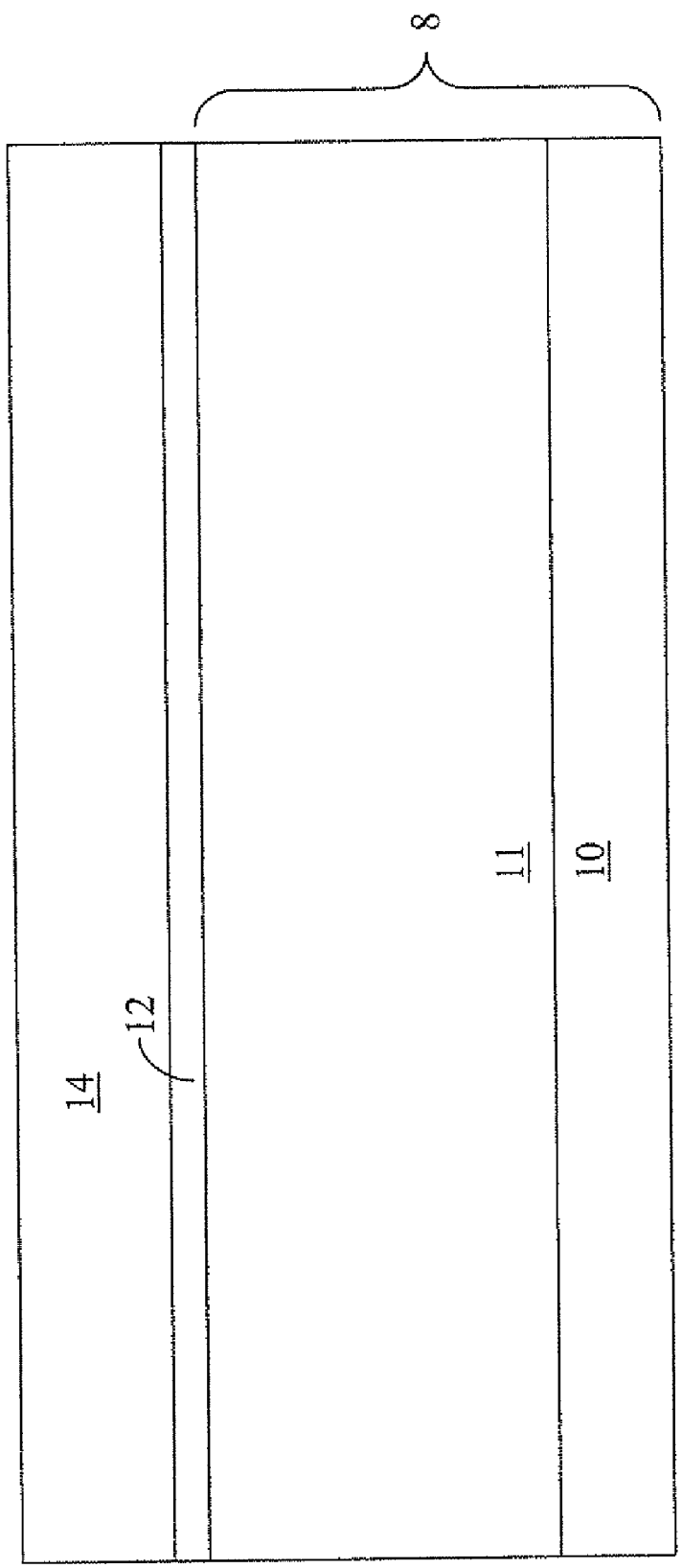
FIGS. 3-12 are sequential vertical cross-sectional views of a first exemplary semiconductor structure according to a first embodiment of the present invention.

Referring to FIG. 3, a first exemplary structure according to a first embodiment of the present invention comprises a semiconductor substrate 8 containing a substrate layer 10, a tub region 11, a pad layer 12, and a masking layer 14. The substrate layer 10 comprises a silicon containing material such as silicon, a silicon germanium alloy, a silicon carbon alloy, or a silicon germanium carbon alloy. The substrate layer 10 may have a p-type doping or an n-type doping at a typical dopant concentration from about $1.0\times10^{14}/cm^3$ to about $1.0\times10^{16}/cm^3$. The doping type of the substrate layer 10 is herein referred to as a first conductivity type. The tub region 11 has a second conductivity type, which is opposite to the first. The tub region 11 has a dopant concentration in the range from about $1.0\times10^{15}/cm^3$ to about $1.0\times10^{17}/cm^3$, although lesser and greater dopant concentrations are also contemplated herein. The tub region 11 may be formed by ion implantation (not shown), which may be followed by an epitaxial growth step. The pad layer 12 comprises an oxide to promote adhesion of the masking dielectric layer 14 to the substrate layer 10. For example, the pad layer 12 may comprise a thermal silicon oxide. The thickness of the pad layer 12 may be from about 3 nm to about 30 nm, and typically from about 6 nm to about 18 nm. The masking layer 14 may comprise a dielectric material such as a dielectric oxide or a dielectric nitride. For example, the masking layer may comprise silicon nitride. The thickness of the masking layer 14 may be from about 10 nm to about 300 nm, and typically from about 50 nm to about 200 nm.

Figure 4:
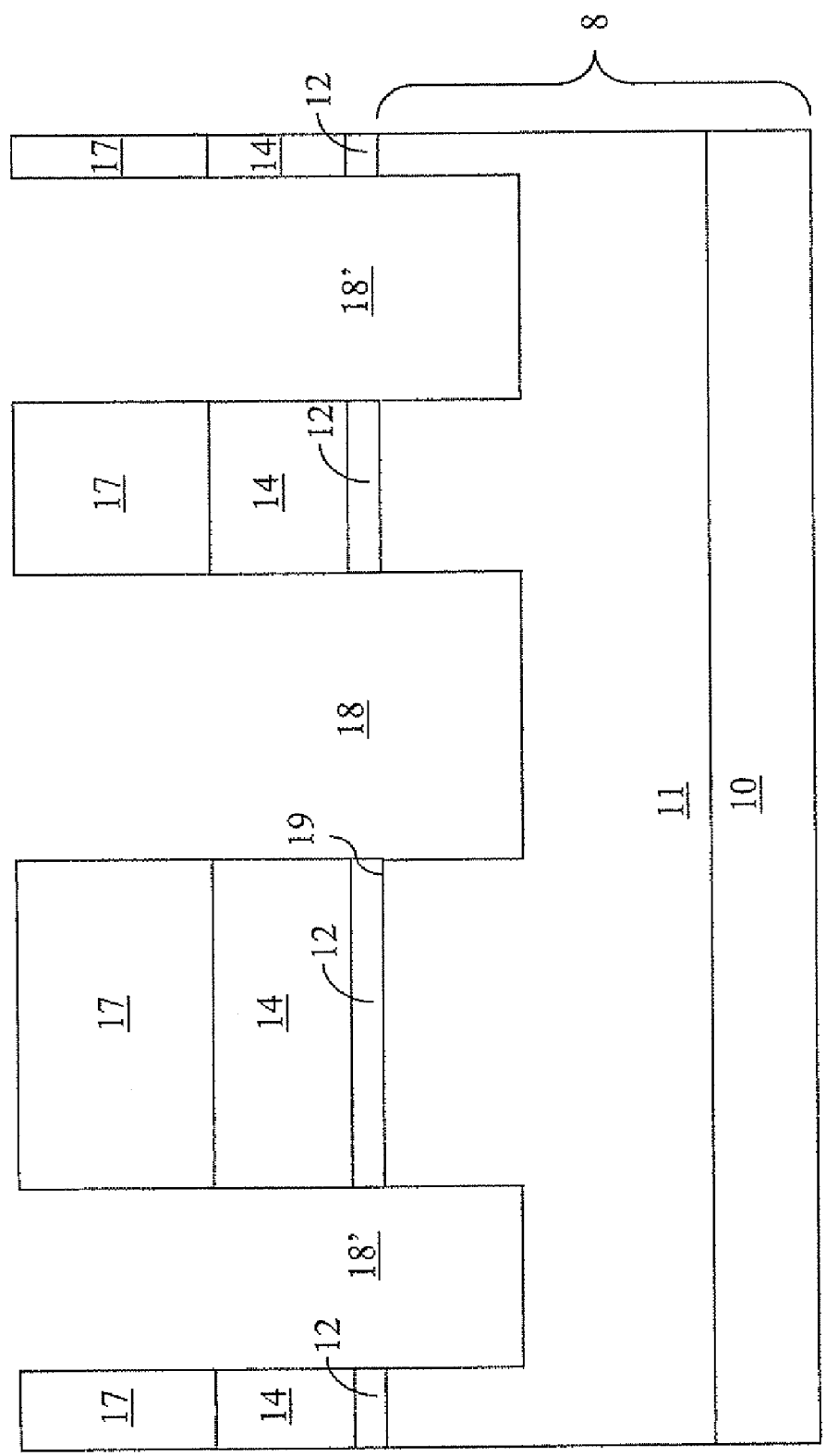

Referring to FIG. 4, a shallow trench 18 and at least another shallow trench 18' are formed in the semiconductor layer 10 by applying and lithographically patterning a first photoresist 17 and transferring the pattern into the masking layer 14, the pad layer 12, and a top portion of the substrate layer 10. The distance between a substrate top surface 19, which is a top surface of the semiconductor substrate 8, and bottom surfaces of the shallow trench 18 and the at least another shallow trench 18' is from about 100 nm to about 1,000 nm, and typically from about 200 nm to about 600 nm. The first photoresist 17 is removed after a pattern transfer into the masking layer 14. The first photoresist 17 may be removed prior to, or after, a pattern transfer into the top portion of the substrate layer 10.

Figure 5:
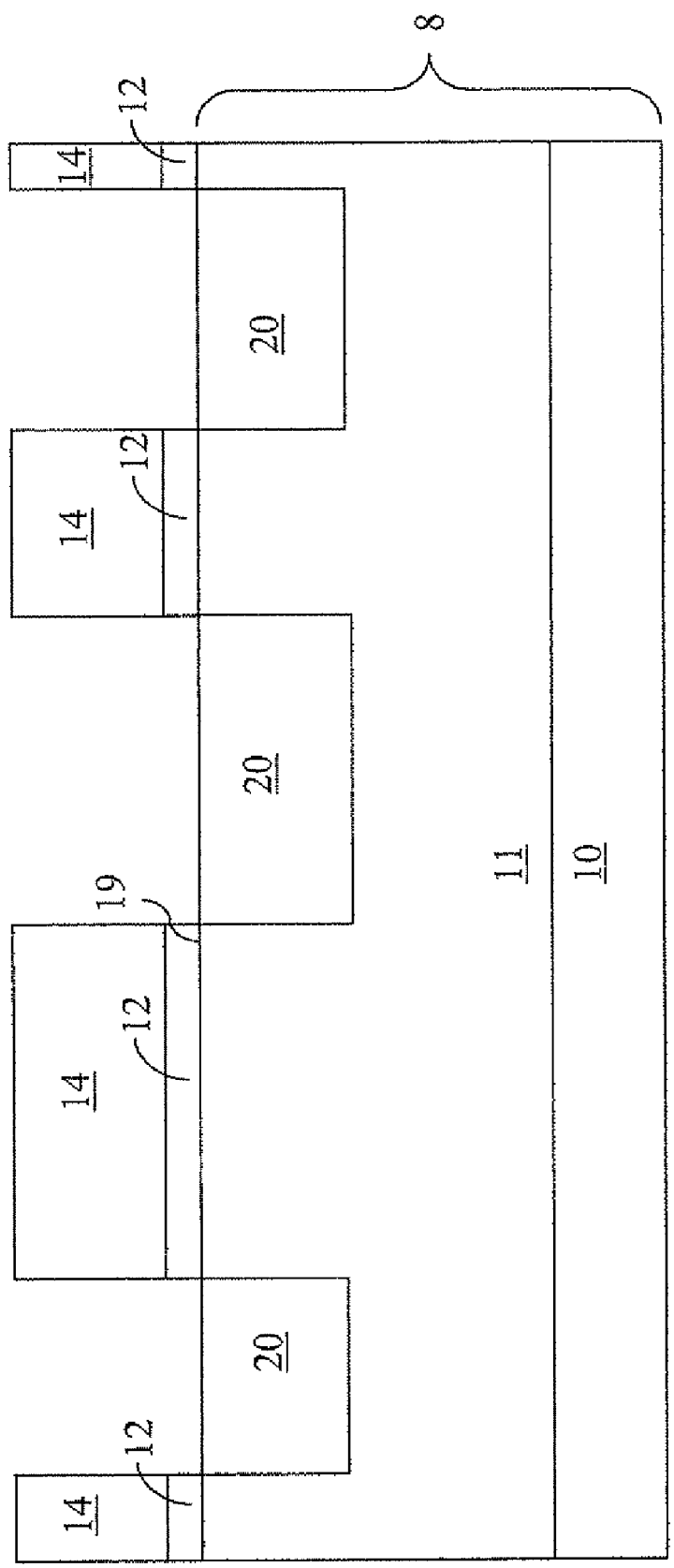

Referring to FIG. 5, the shallow trench 18 and the at least another shallow trench 18' are filled with a dielectric material such as silicon oxide deposited by chemical vapor deposition (CVD). High density plasma chemical vapor deposition (HD-PCVD) or low pressure chemical vapor deposition (LPCVD) may be employed for deposition of the silicon oxide. The dielectric material is planarized employing methods well known in the art. For example, chemical mechanical planarization may be employed to planarize the dielectric material so that top surfaces of the dielectric material are substantially flush with top surfaces of the masking layer 14. The dielectric material is further recessed selective to the masking layer 14 so that the top surfaces of the dielectric material are substantially flush with the substrate top surface 19. The remaining dielectric material in the shallow trenches constitutes shallow trench isolation 20.

Figure 6:
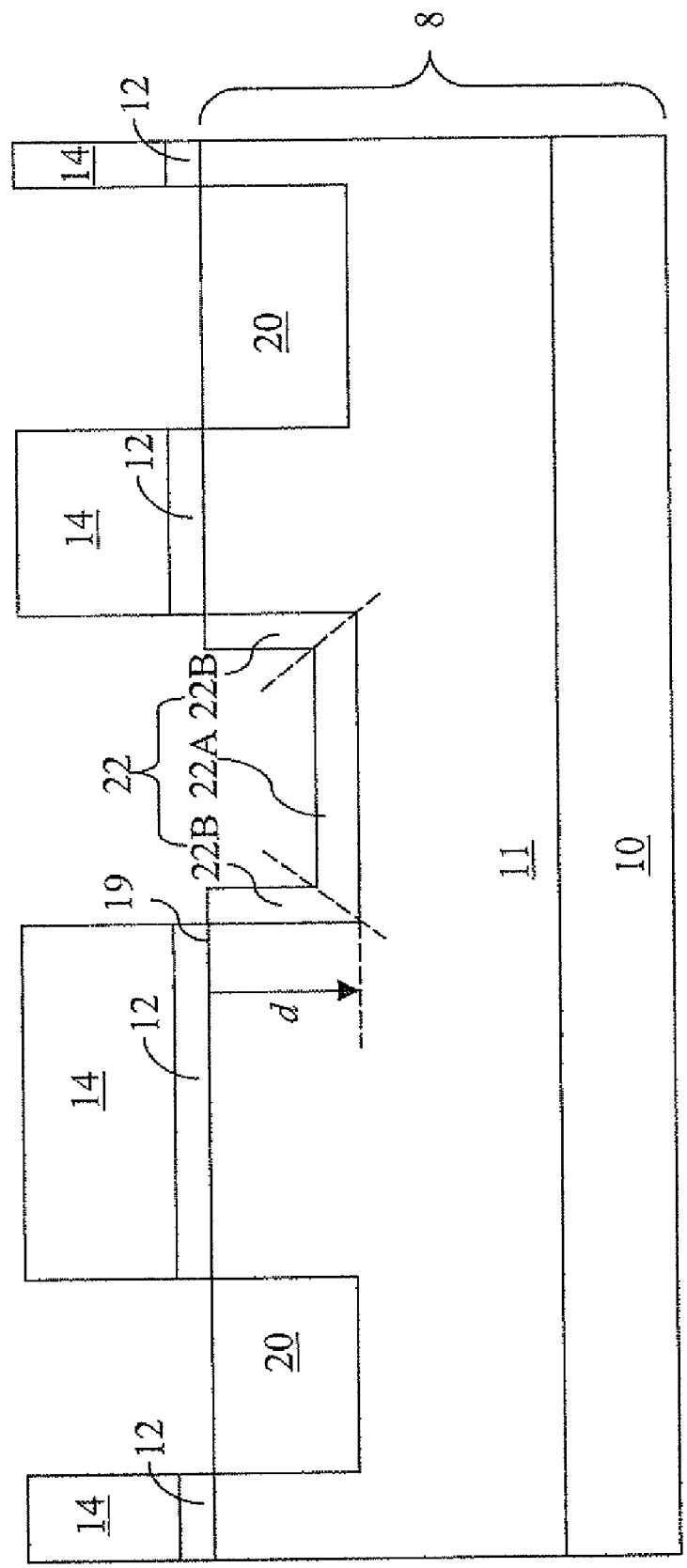

Referring to FIG. 6, a second photoresist (not shown) is applied over the masking layer 14 and the shallow trench isolation 20 and patterned to remove the dielectric material within the shallow trench 18, while the dielectric material in at least another trench 18' is protected under the second photoresist. A wet etch or a dry etch may be employed. After removal of the dielectric material in the shallow trench 18, a trench bottom surface and at least one trench sidewall are exposed in the shallow trench 18. The second photoresist is removed subsequently.

A drift region dielectric 22 of unitary construction comprising another dielectric material is formed on the trench bottom surface and the at least one trench sidewall. The drift region dielectric contains a bottom dielectric portion 22A which vertically abuts the trench bottom surface and a sidewall dielectric portion 22B which laterally abuts the at least one trench sidewall. Since the drift region dielectric 22 is of unitary construction, the division of the drift region dielectric 22 into the bottom dielectric portion 22A and the sidewall dielectric portion 22B is only for description of the present invention. There is no physical interface having any compositional changes or discontinuity of material between the bottom dielectric portion 22A and the sidewall dielectric portion 22B.

The drift region dielectric 22 may be formed by thermal oxidation of the bottom surface and the at least one sidewall of the exposed surfaces of the shallow trench 18. Since the substrate layer 10 comprises a silicon containing material, the drift region dielectric 22 comprises a thermal silicon oxide. In case the substrate layer 10 is silicon, the drift region dielectric 22 is thermal silicon oxide. The depth d of the trench bottom surface, which is an interface between a bottom surface of the bottom dielectric portion 22A and the substrate layer 10, as measured from the substrate top surface 19 may be from about 100 nm to about 1,000 nm, and typically from about 200 nm to about 600 nm, although lesser and greater depths are also contemplated herein.

Figure 7:
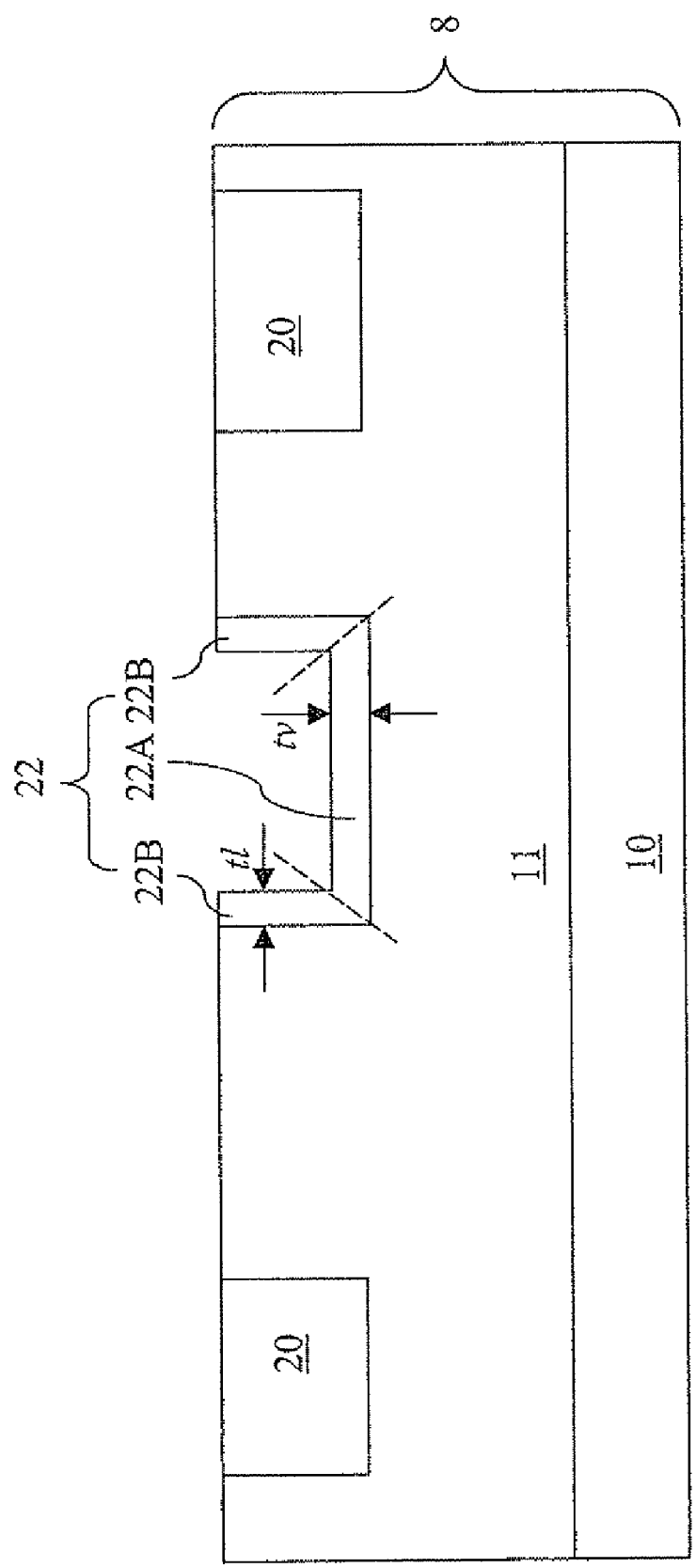

Referring to FIG. 7, the masking layer 14 and the pad layer 12 are removed, for example, by a wet etch. The lateral thickness tl of the sidewall dielectric portion 22B is substantially the same as the vertical thickness tv of the bottom dielectric portion 22A after the removal of the masking layer 14 and the pad layer 12, and may be from about 6 nm to about 100 nm, and typically from about 10 nm to about 50 nm.

Figure 8:
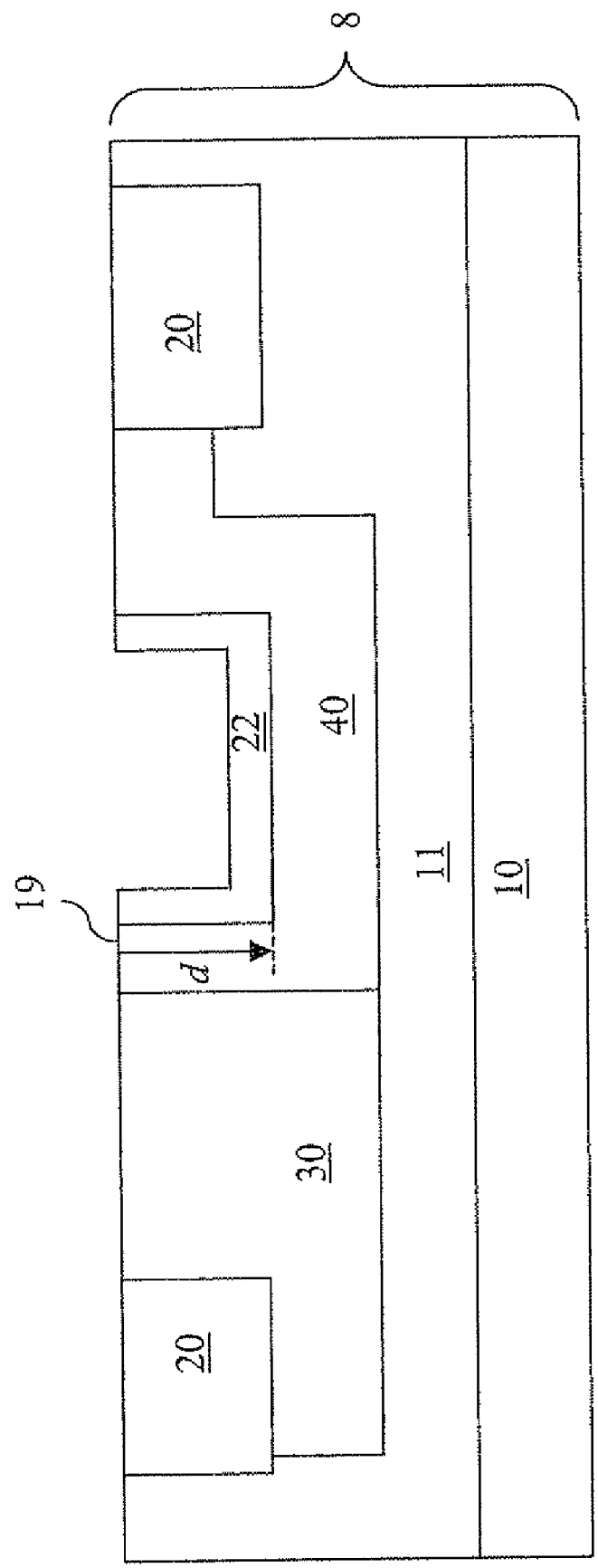

Referring to FIG. 8, a body 30 having a doping of the first conductivity type is formed by ion implantation of dopant ions of the first conductivity type employing a block level photoresist (not shown). The body 30 has a dopant concentration in the range from about $1.0\times10^{15}/cm^3$ to about $3.0\times10^{18}/cm^3$, and preferably from about $1.0\times10^{16}/cm^3$ to about $3.0\times10^{17}/cm^3$, although lesser and greater dopant concentrations are also contemplated herein. The depth of the body 30, i.e., a vertical distance between the substrate top surface 19 and a bottom surface of the body 30 may, or may not, exceed the depth d of the trench bottom surface. The exposed portions of the body 30 may be self-aligned to a portion of the shallow trench isolation 20.

A drift region 40 having a doping of the second conductivity type is formed by ion implantation of dopant ions of the second conductivity type employing another block level photoresist (not shown). The drift region 40 has a dopant concentration in the range from about $1.0\times10^{15}/cm^3$ to about $3.0\times$ $10^{18}/cm^3$, and preferably from about $1.0 \times 10^{16}/cm^3$ to about $3.0 \times 10^{17}/cm^3$, although lesser and greater dopant concentrations are also contemplated herein. The depth of the drift region 40, i.e., a vertical distance between the substrate top surface 19 and a bottom surface of the drift region 40 exceeds the depth d of the trench bottom surface. The exposed portion of the drift region 40 may be self-aligned to another portion of the shallow trench isolation 20.

Figure 9:
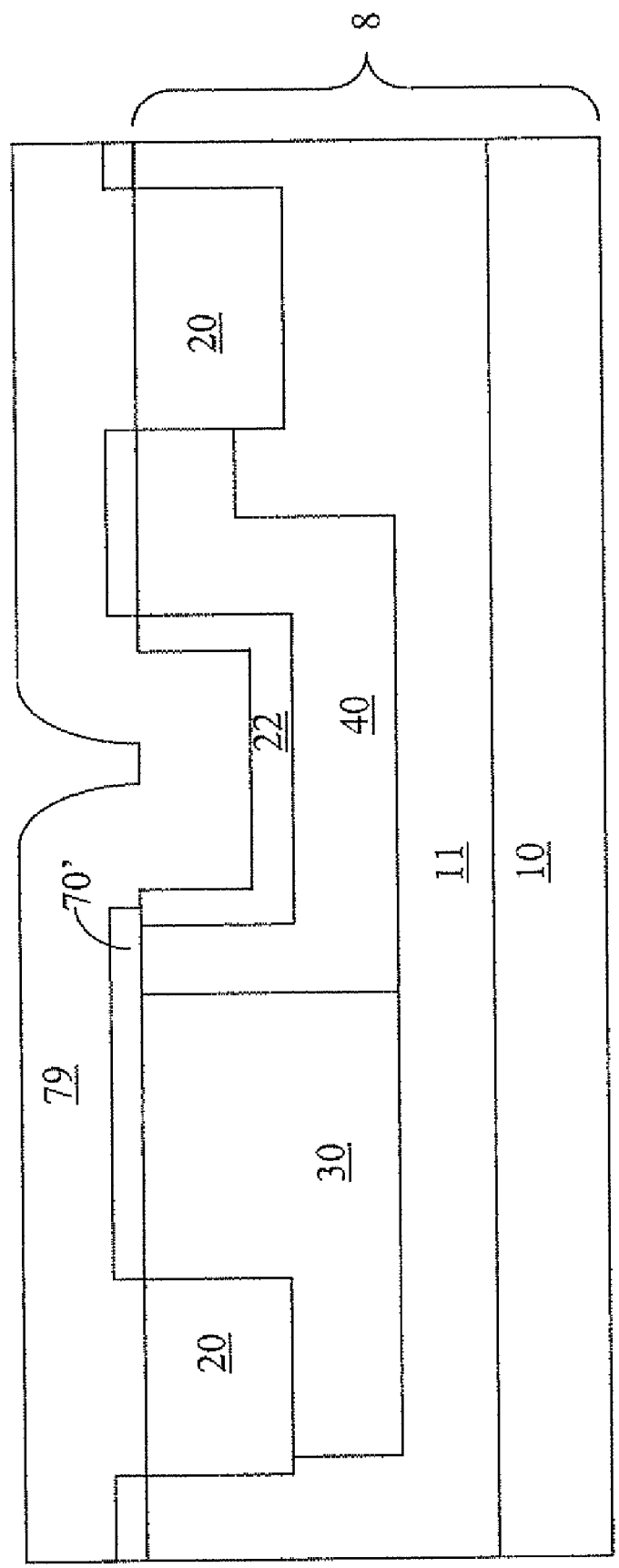

Referring to FIG. 9, a gate dielectric layer 70' and a gate electrode layer 79 are formed on the body 30 and the drift region 40. The gate dielectric layer 70' may comprise a conventional silicon oxide containing gate dielectric material such as thermal silicon oxide or thermal silicon oxynitride, or a high-k gate dielectric material known in the art. The gate electrode layer 79 may comprise a conventional gate conductor material such as doped polysilicon or a doped polycrystalline silicon containing alloy, or a metal gate material compatible with the high-k gate dielectric material. The thickness of the gate dielectric layer 70' may be from 1 nm to about 50 nm, and typically from about 6 nm to about 24 nm, although lesser and greater thicknesses are also contemplated herein. The thickness of the gate electrode layer 79 may be from about 60 nm to abut 300 nm, and typically from about 100 nm to about 200 nm, although lesser and greater thicknesses are also contemplated herein.

Figure 10:
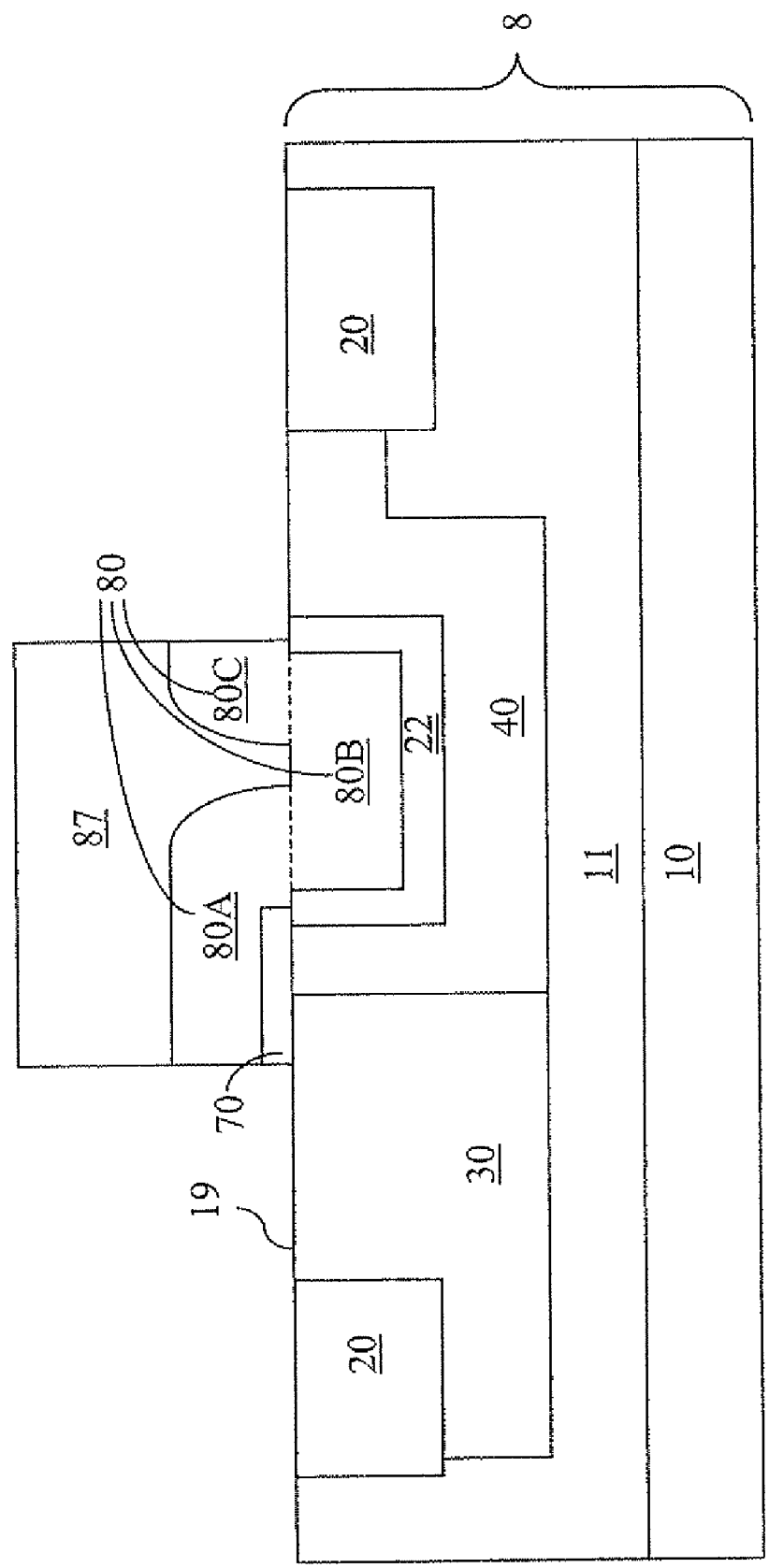

Referring to FIG. 10, a third photoresist 87 is applied and lithographically patterned over the gate electrode layer 79 (See FIG. 9). The pattern in the third photoresist 87 is transferred into the gate conductor layer 79 and the gate dielectric layer 70'. The remaining portion of the gate electrode layer 79 constitutes a gate electrode 80. The remaining portion of the gate dielectric layer 70' located directly on the body 30 and the drift region 40 constitutes a gate dielectric 70.

The gate electrode 80 may comprise a first portion 80A located above the substrate top surface 19 and abutting the gate dielectric 70, a second portion 80B located below the substrate top surface 19 and abutting the drift region dielectric 22, and a third portion 80C located above the substrate top surface 19 and not directly contacting the first portion 80A. Depending on geometry, the third portion 80C may, or may not, be formed. The first portion 80A provides electrical bias to the body 30 and the drift region 40 in the same manner as a gate electrode of a conventional LDMOSFET. The second portion 80B functions as a field plate which provides modulation of the conductivity and electric field of the drift region 40.

The first portion 80A, the second portion 80B, and the third portion 80C are integrally formed, i.e., formed at the same processing steps without any physical interface therebetween. As a consequence, the first portion 80A, the second portion 80B, and the third portion 80C are of unitary construction, i.e., constructed as one piece. Therefore, all portions (80A, 80B, 80C) of the gate electrode 80 are biased at the same gate potential. One edge of the gate electrode 80 is located over the body 30. The other edge of the gate electrode 80 may be located on the drift region dielectric 22, or alternatively, over the second portion 80B.

Figure 11:
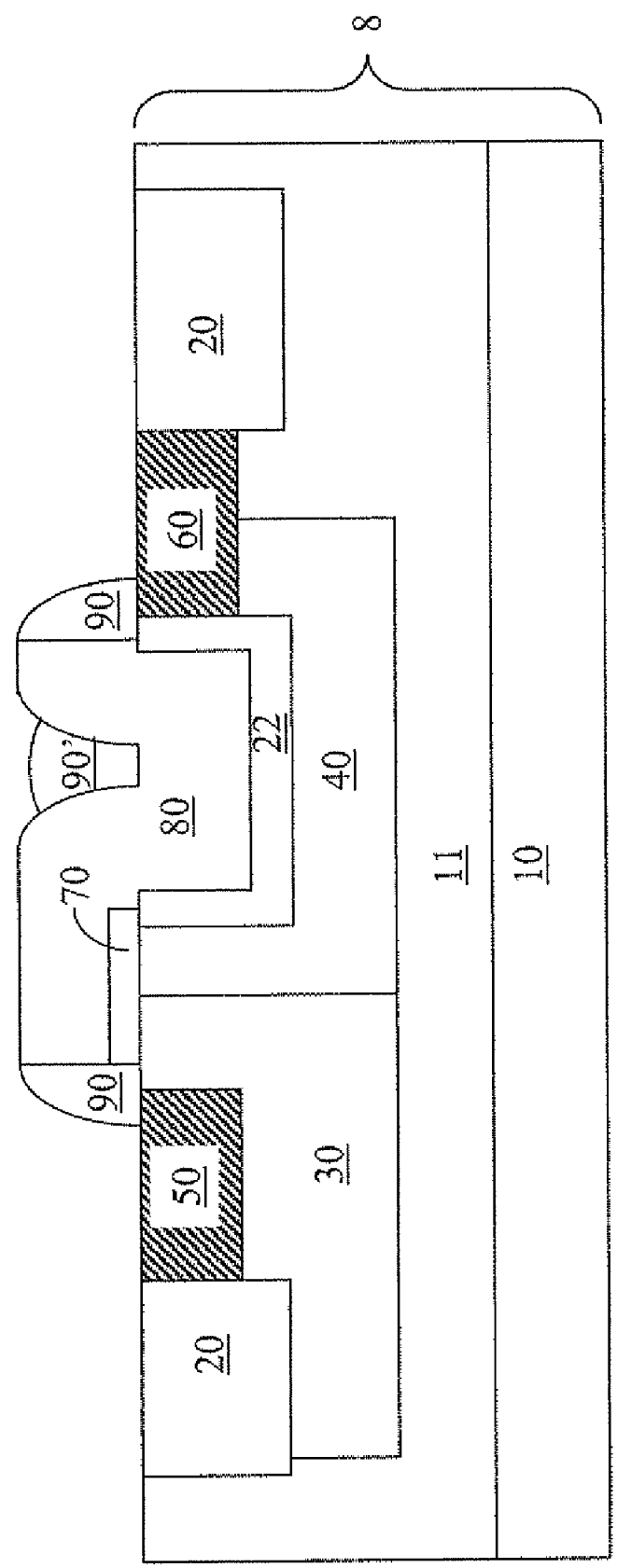

Referring to FIG. 11, a gate spacer 90 comprising a dielectric material is formed on sidewalls of the gate electrode 80. A gate recess fill region 90' comprising the same dielectric material may be formed within a recessed region of the gate electrode 80. Dopants of the second conductivity type are implanted into exposed portions of the body 30 and the drift region 40 employing the gate electrode 80 and the gate spacer 90 as implantation masks to form a source region 50 and a drain region 60, respectively. The source region 50 is self-aligned to an edge of the gate electrode 80 with an offset and the drain region 60 is self-aligned to an outer sidewall of the drift region dielectric 22, which is one of the at least one trench sidewall. The offset is determined by lateral straggle of dopants implanted into the body 30 and the thickness of the gate spacer 90 on the gate electrode 80.

Figure 12:
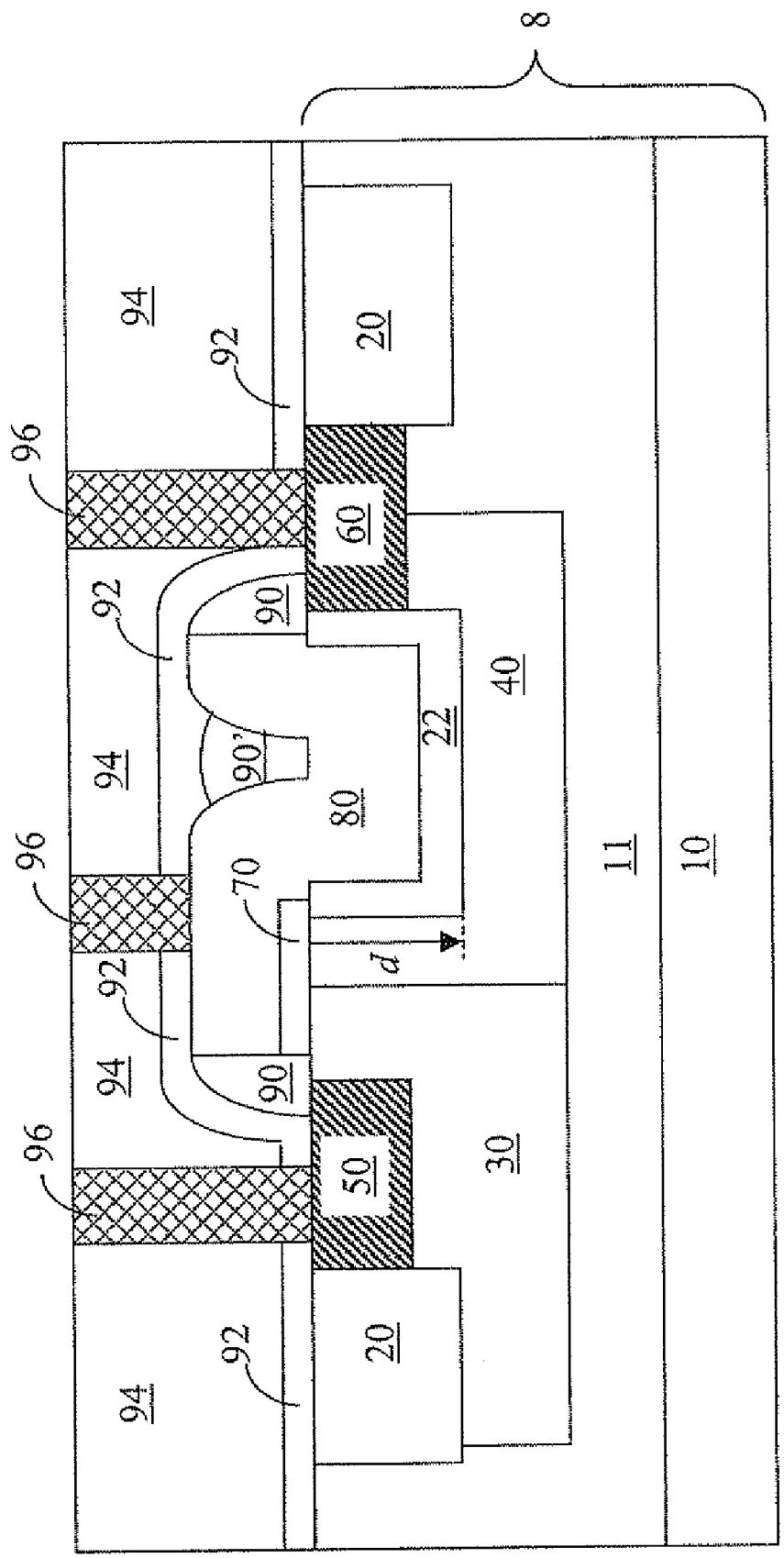

Referring to FIG. 12, conventional middle-of-line (MOL) structures are formed to provide electrical contacts to the first exemplary semiconductor structure. A mobile ion diffusion barrier layer 92 may be formed directly on the source region 50, the drain region 60, the gate electrode 80, and the gate spacer 90. The mobile ion diffusion barrier layer 92 may comprise a dielectric material that prevents diffusion of mobile ions such as $Na^+$ and $K^+$ from the MOL structures and back-end-of-line (BEOL) structures. For example, the mobile ion diffusion barrier layer 92 may comprise silicon nitride. A middle-of-line (MOL) dielectric layer 94 may be formed on the mobile ion diffusion barrier layer 92. The MOL dielectric layer 94 comprises a dielectric material such as undoped silicate glass (USG), fluorosilicate glass (FSG), and low-k dielectric material. Contact holes are etched in the MOL dielectric layer and filled with a conductive material such as metal to form contact vias 96 to the source region 50, the drain region 60, and the gate electrode 80. Although not shown, the body region 30 may be contacted in a similar fashion, for example by extending the body region 30 laterally beyond the shallow trench isolation region 20 and forming a contact in that region. The substrate layer 10 may be independently biased as necessary.

Figure 13:
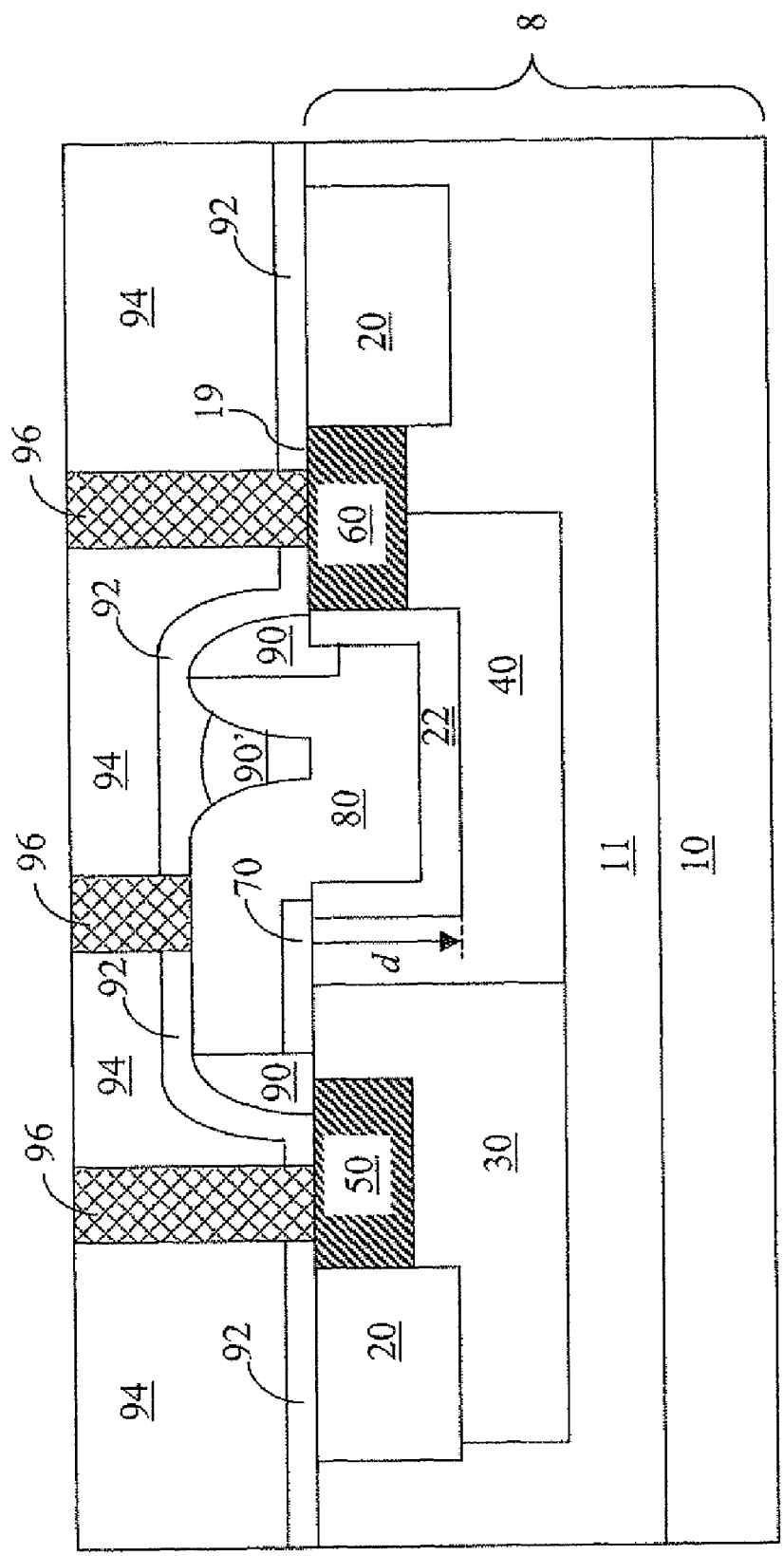
FIG. 13 is a vertical cross-sectional view of a variation of the first exemplary semiconductor structure.

Referring to FIG. 13, a variation on the first exemplary semiconductor structure comprises a gate electrode 80 of which an edge is located directly above a portion of the gate electrode 80 beneath the substrate top surface 19. In case the lateral thickness tl of the sidewall dielectric portion 22B (See FIG. 7) is less than the overlay tolerance of lithography tools employed to pattern the gate electrode 80, such placement of the edge of the gate electrode 80 may be preferred.

Figure 14:
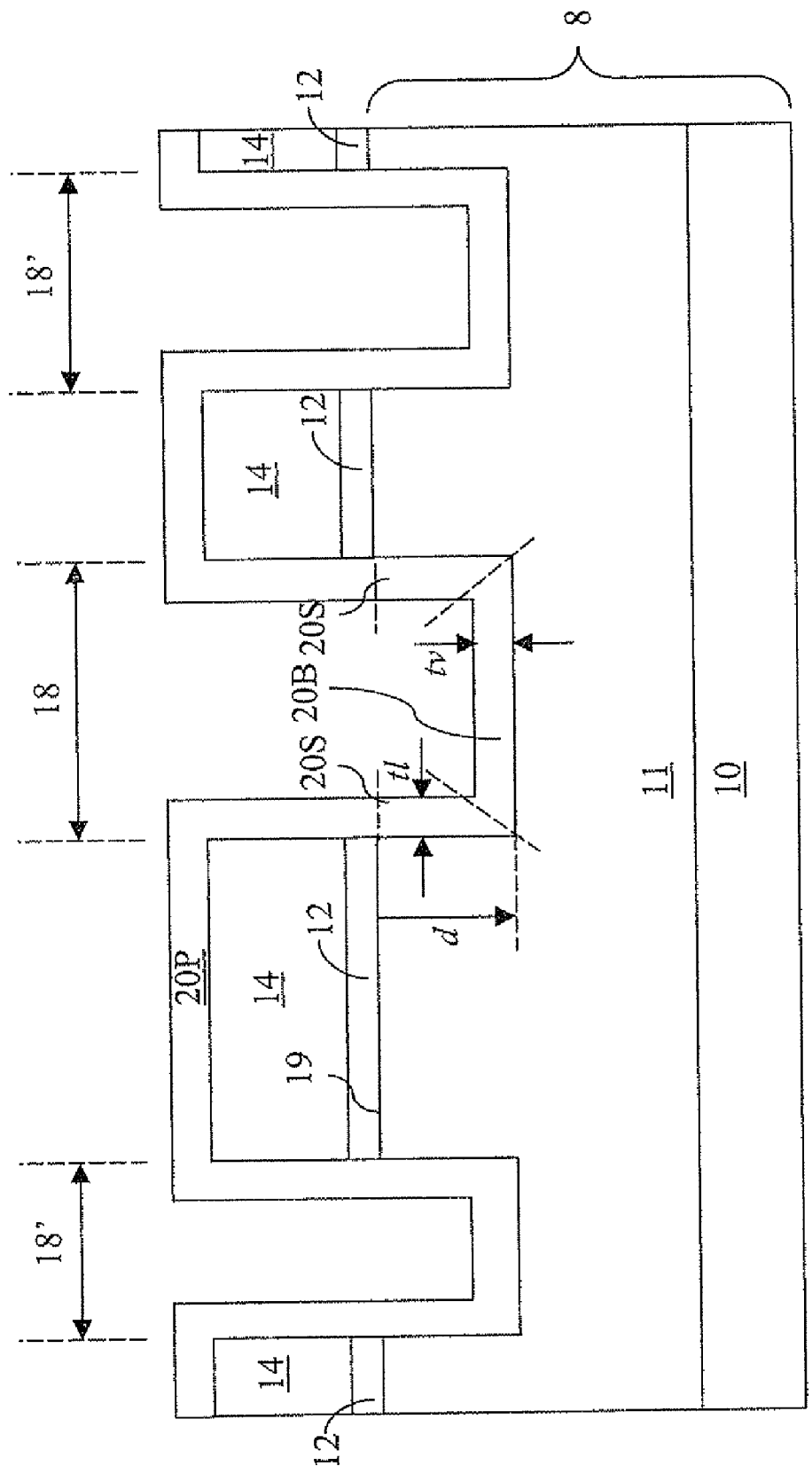
FIGS. 14-23 are sequential vertical cross-sectional views of a second exemplary semiconductor structure according to a second embodiment of the present invention.

Referring to FIG. 14, a second exemplary semiconductor structure according to a second embodiment of the present invention is derived from the first exemplary semiconductor structure of FIG. 4 by removing the first photoresist 17 and forming a first dielectric material layer 20P on the exposed surfaces of the shallow trench 18 and the at least another shallow trench 18'. The first dielectric material layer 20P comprises a dielectric material such as a dielectric oxide or a dielectric nitride. For example, the first dielectric material layer 20P may comprise silicon oxide or silicon nitride deposited by chemical vapor deposition (CVD) such as high density plasma chemical vapor deposition (HDPCVD) or low pressure chemical vapor deposition (LPCVD). The first dielectric material layer 20P contains a bottom dielectric portion 20B vertically abutting the trench bottom surface and a sidewall dielectric portion 20S laterally abutting the at least one trench sidewall below the substrate top surface 19. The shape of the sidewall dielectric portion 20S may be topologically homeomorphic to a torus. The lateral thickness tl of the first dielectric material layer 20P within the shallow trench 18 is substantially the same as the vertical thickness tv of the first dielectric material layer 20P on the trench bottom surface of the shallow trench 18, and may be from about 6 nm to about 100 nm, and typically from about 10 nm to about 50 nm.

Figure 15:
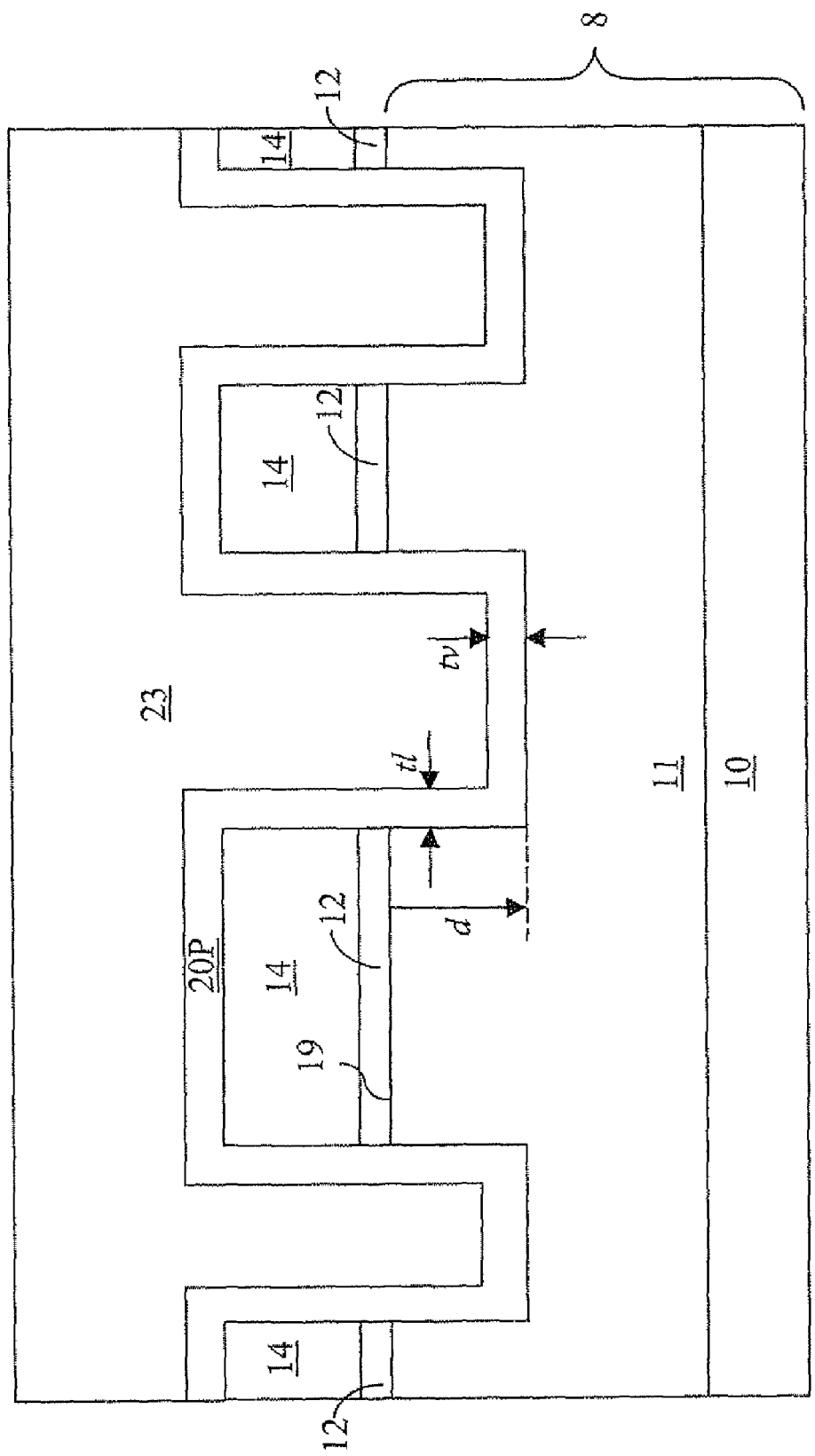

Referring to FIG. 15, a conductive material layer 23 is deposited on the first dielectric material layer 20P, for example, by chemical vapor deposition (CVD). The conductive material layer 23 may comprise a conductive material such as a doped semiconductor material, an elemental metal, or a metal alloy. For example, the conductive material layer 23 may comprise doped polysilicon or a doped polycrystalline silicon containing alloy. The shallow trench 18 and the at least another shallow trench 18' (See FIG. 14) are filled with the conductive metal layer 23.

Figure 16:
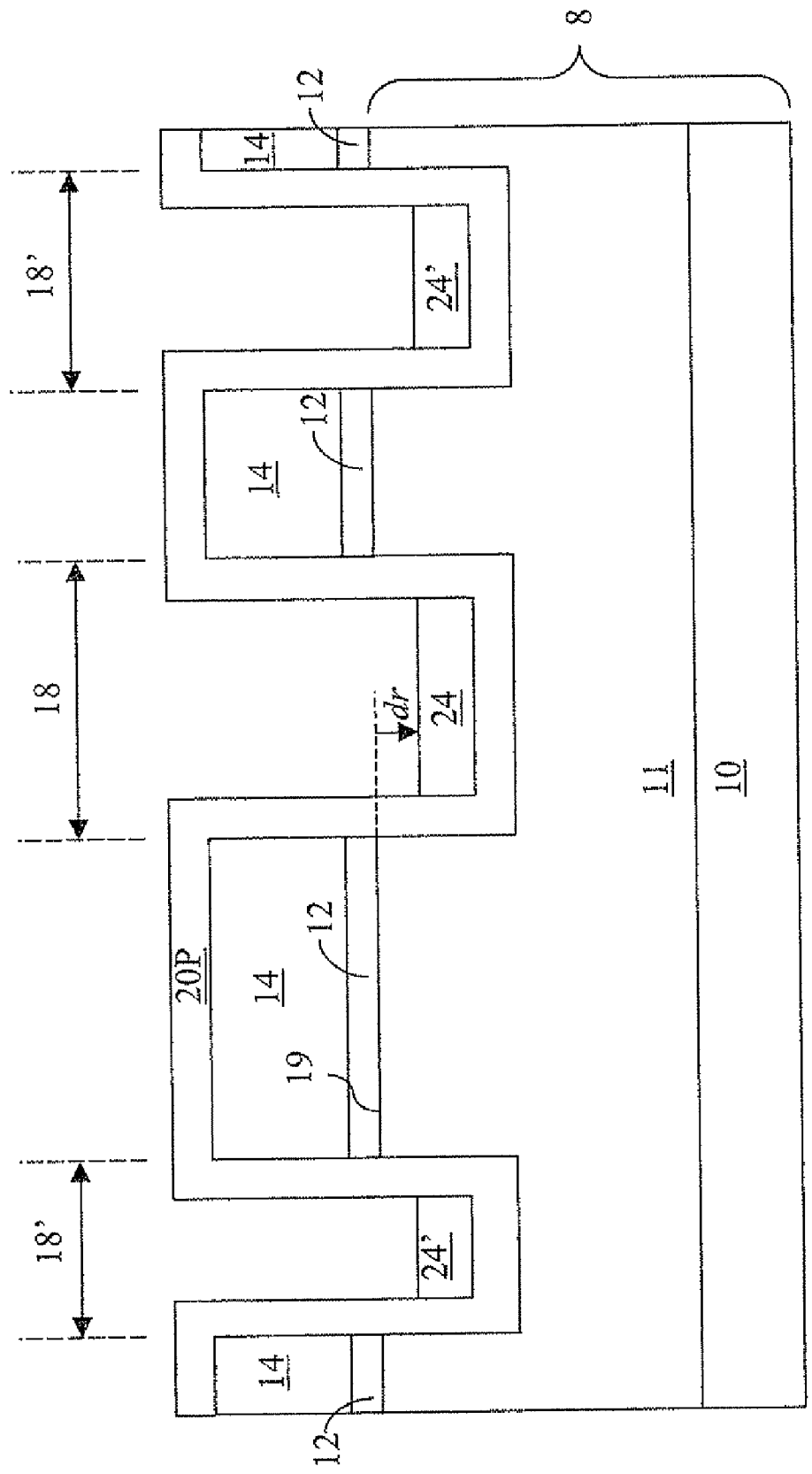

Referring to FIG. 16, the conductive material layer 23 is recessed below the substrate top surface 19 to form a field plate 24 in the shallow trench 18 and conductive material portions 24' in the at least another shallow trench 18'. Chemical mechanical polishing (CMP) may be used to planarize the conductive material layer 23 to a level that is substantially flush with top surfaces of the first dielectric material layer 20P. A reactive ion etch or a wet etch may be employed to recess the conductive material layer 23 within the shallow trench 18 and the at least another shallow trench 18'. A recess depth dr, which is a vertical distance between the substrate top surface 19 and a top surface of the field plate 24 may be from about 10 nm to about 100 nm, and preferably from about 10 nm to about 30 nm, although lesser and greater recess depths dr are explicitly contemplated herein.

Figure 17:
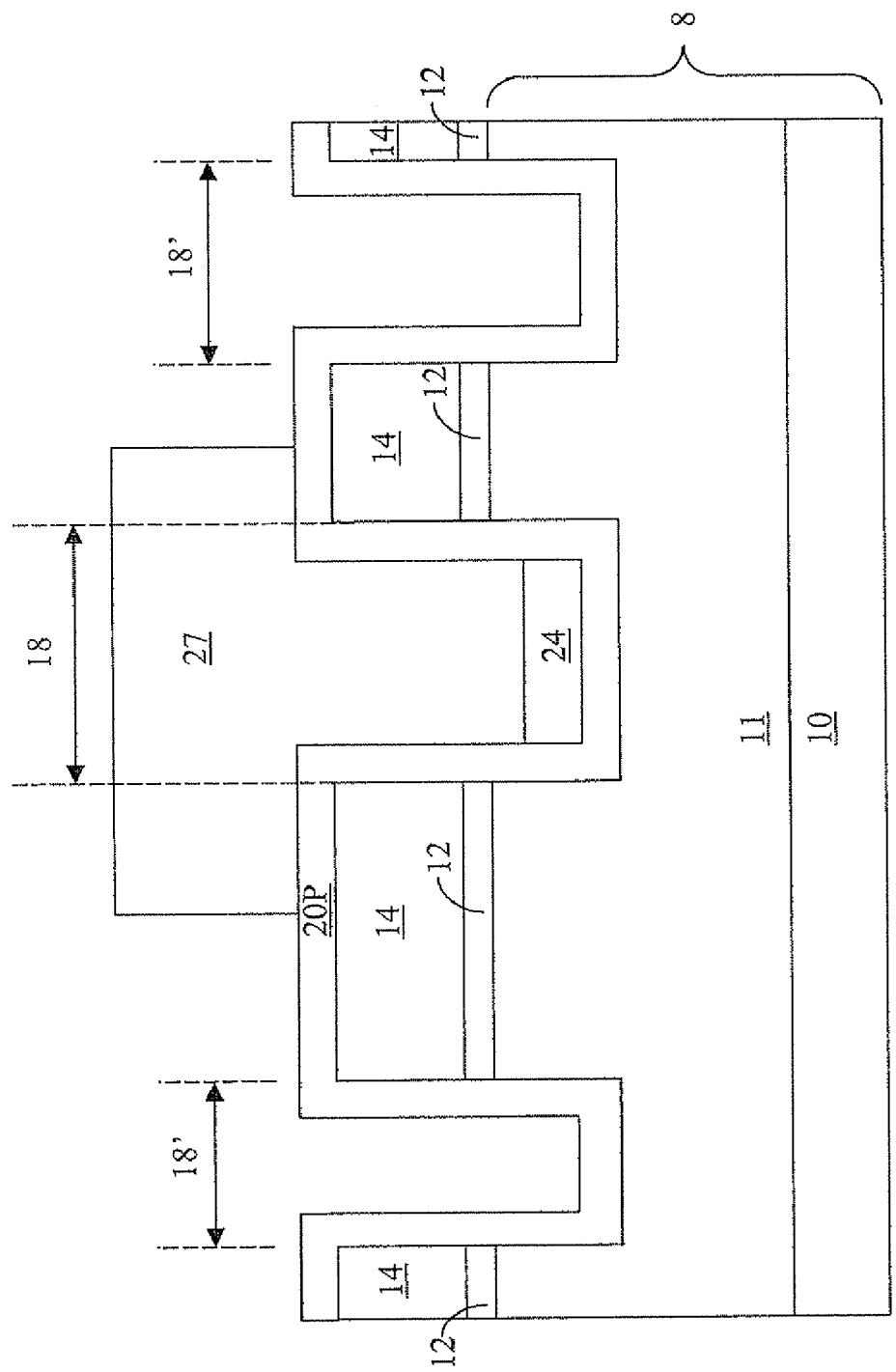

Referring to FIG. 17, a block level photoresist 27 is applied and lithographically patterned to cover the shallow trench 18, while exposing the at least another shallow trench 18'. The conductive material portions in the at least another shallow trench 18' is removed, for example, by a reactive ion etch or a wet etch.

Figure 18:
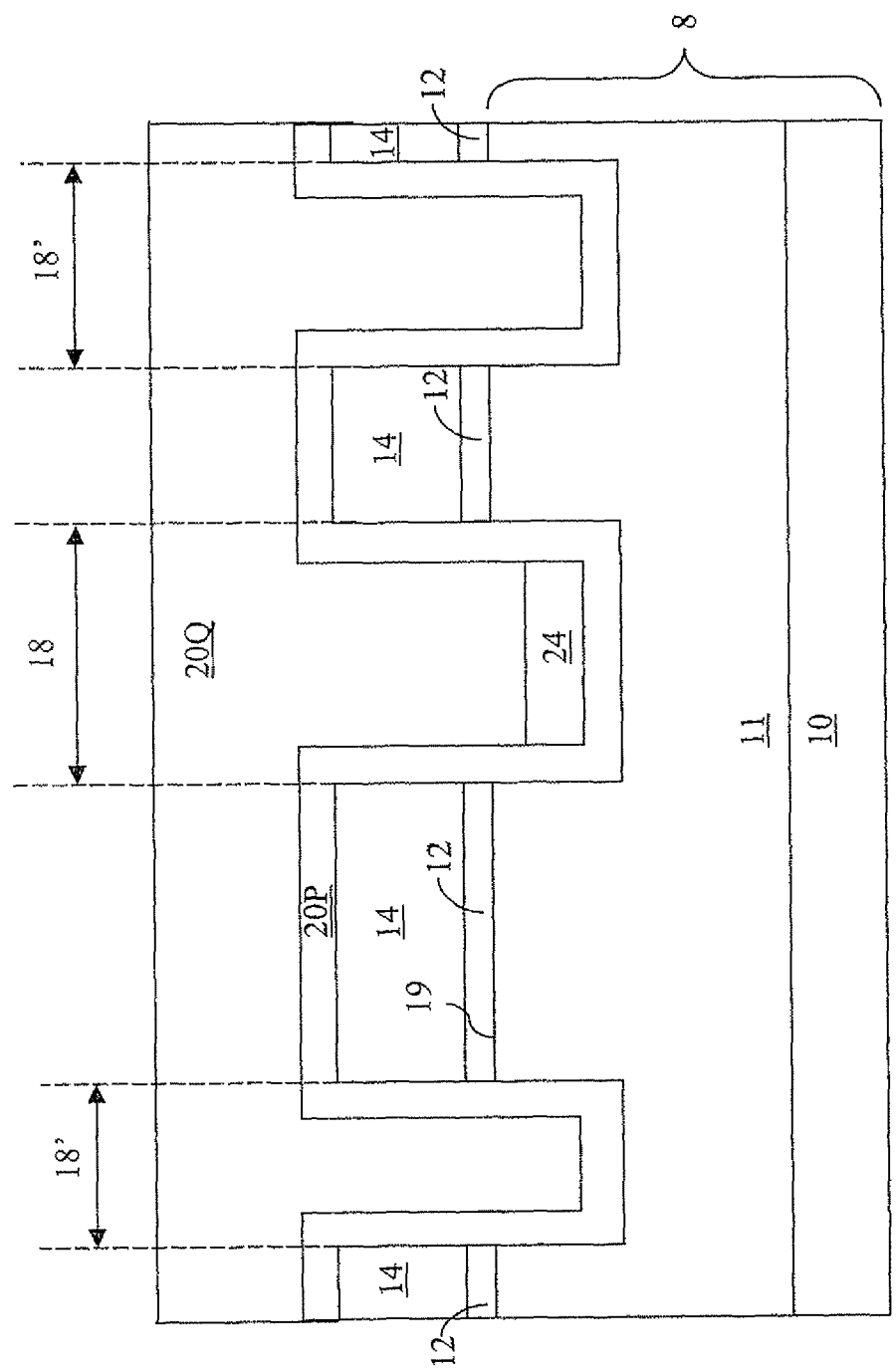

Referring to FIG. 18, a second dielectric material layer 20Q is formed on the first dielectric material layer 20P and the field plate 24. The second dielectric material layer 20Q comprises a dielectric material such as a dielectric oxide or dielectric nitride. For example, the second dielectric material layer 20Q may comprise silicon oxide deposited by chemical vapor deposition (CVD).

Figure 19:
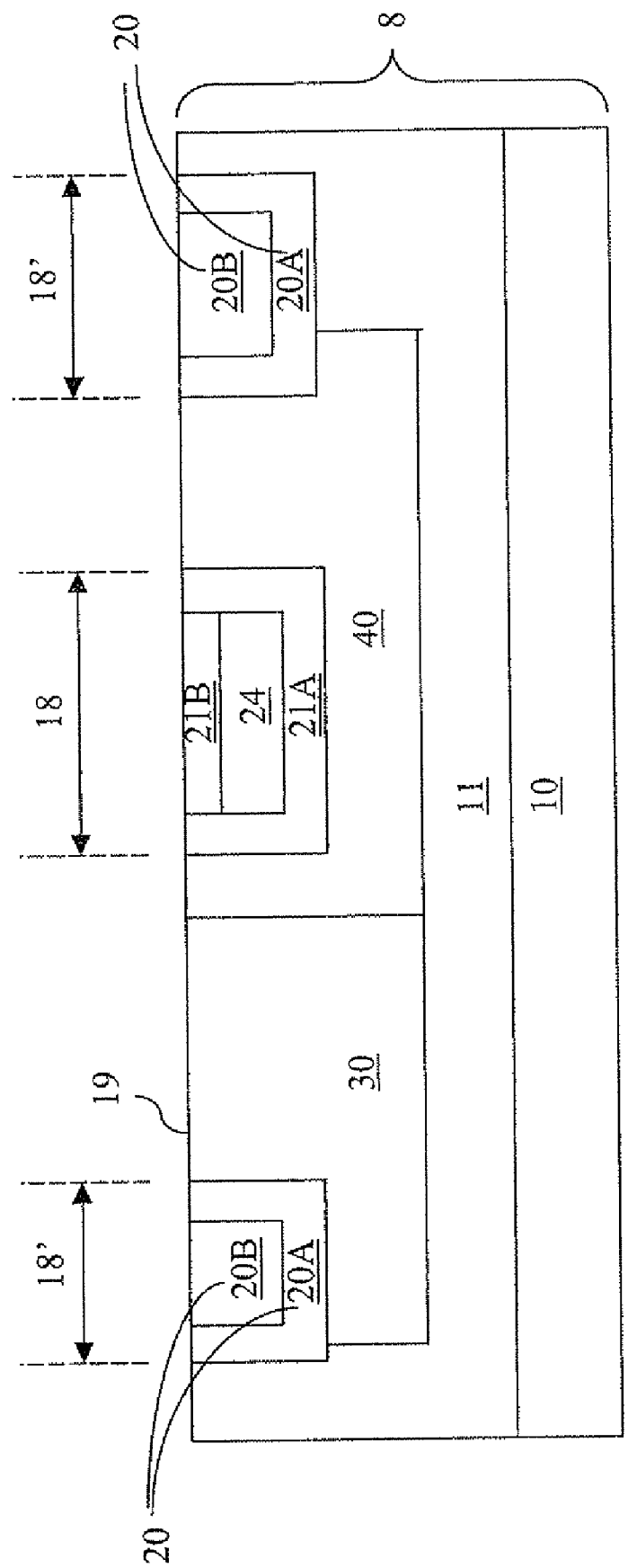

Referring to FIG. 19, the first and second dielectric material layers (20P, 20Q) are planarized. For example, employing top surfaces of the masking layer 14 as a stopping layer, the first and second dielectric material layers (20P, 20Q) may be planarized in a chemical mechanical polishing (CMP) step. Thereafter, the first and second dielectric material layers (20P, 20Q) are recessed in the shallow trench 18 and the at least another shallow trench 18' to a level that is substantially flush with the substrate top surface 19. The masking layer 14 and the pad layer 12 are removed subsequently.

The remaining portion of the first dielectric material layer 20P within the shallow trench 18 constitutes a drift region dielectric 21A. The remaining portion of the second dielectric material layer 20Q within the shallow trench 18 constitutes a field plate cap 21B, which has a thickness from about 10 nm to about 100 nm, and preferably from about 10 nm to about 30 nm, although lesser and greater thicknesses are explicitly contemplated herein.

The remaining portions of the first dielectric material layer 20P within the at least another shallow trench 18' constitute first shallow trench isolation (STI) dielectric portions 20A. The remaining portions of the second dielectric material layer 20Q within the at least another shallow trench 18' constitute second shallow trench isolation (STI) dielectric portions 20B. The first STI dielectric portions 20A and the second STI dielectric portions 20B collectively comprise shallow trench isolation 20.

A body 30 having a doping of the first conductivity type and a drift region 40 having a doping of the second conductivity type area formed as in the first embodiment.

Figure 20:
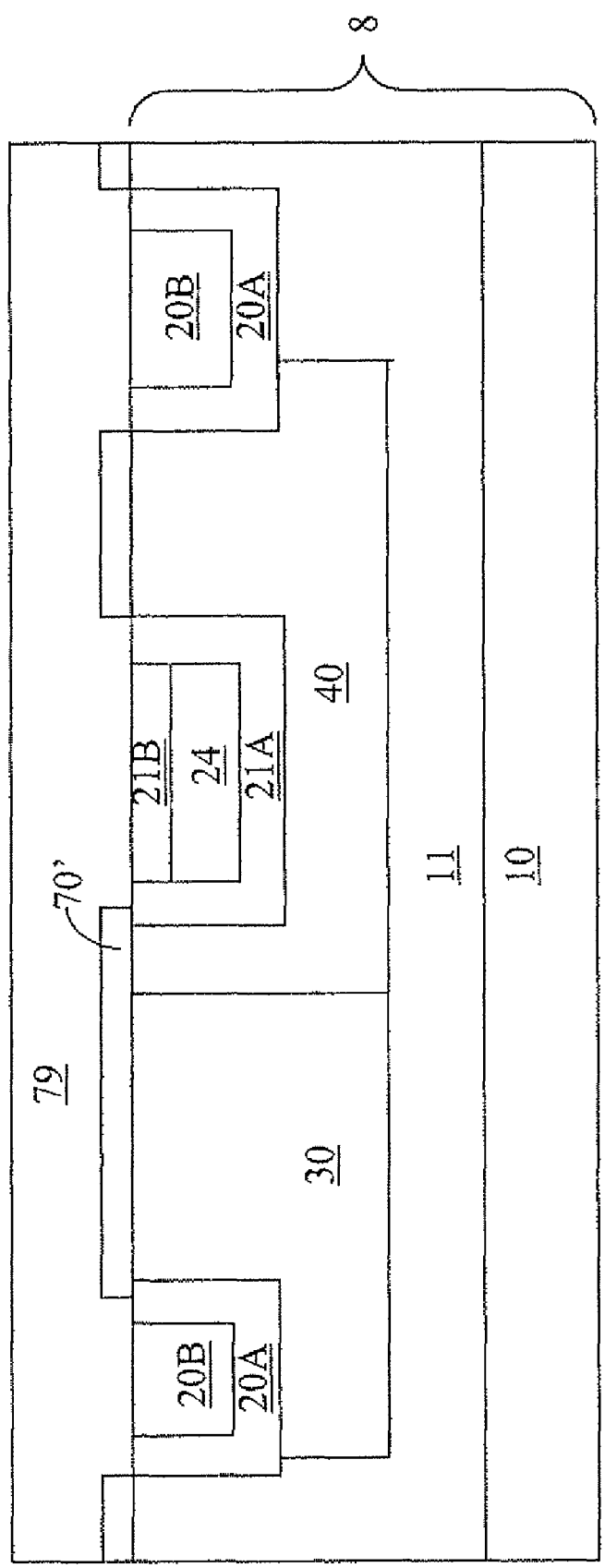

Referring to FIG. 20, a gate dielectric layer 70' and a gate electrode layer 79 are formed on the body 30 and the drift region 40 as in the first embodiment. The gate electrode layer 79 is formed on and above a top surface of the field plate cap 21B.

Figure 21:
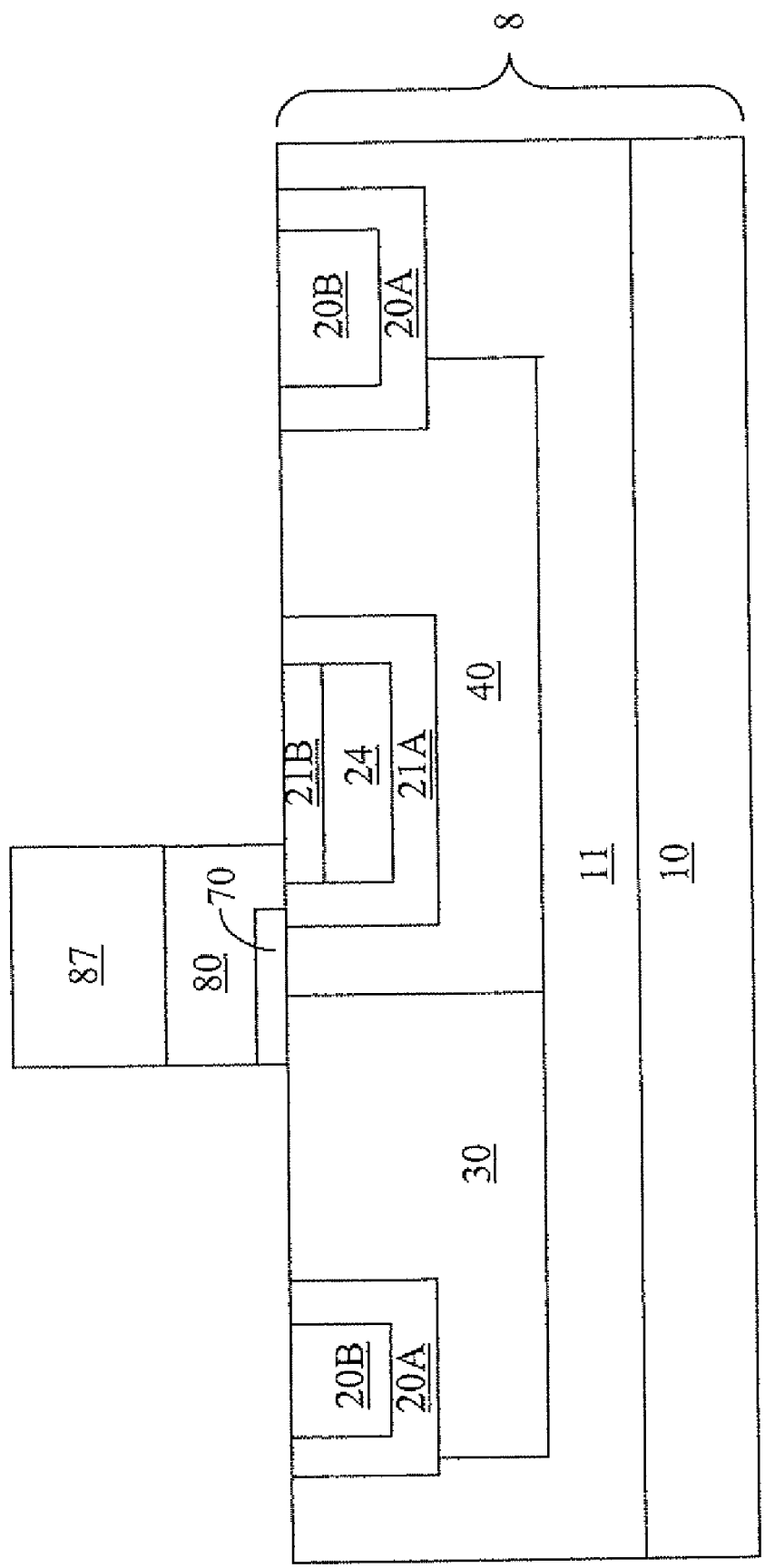

Referring to FIG. 21, a third photoresist 87 is applied and lithographically patterned over the gate electrode layer 79 (See FIG. 9). The pattern in the third photoresist 87 is transferred into the gate conductor layer 79 and the gate dielectric layer 70'. The remaining portion of the gate electrode layer 79 constitutes a gate electrode 80. The remaining portion of the gate dielectric layer 70' located directly on the body 30 and the drift region 40 constitutes a gate dielectric 70. The gate electrode 80 may, or may not, overlap the field plate 24. The area of overlap and the thickness and the dielectric constant of the field plate cap 21B determine the degree of capacitive coupling between the gate electrode 80 and the field plate 24. The field plate cap 21B separates the gate electrode 80 from the field plate 24.

Figure 22:
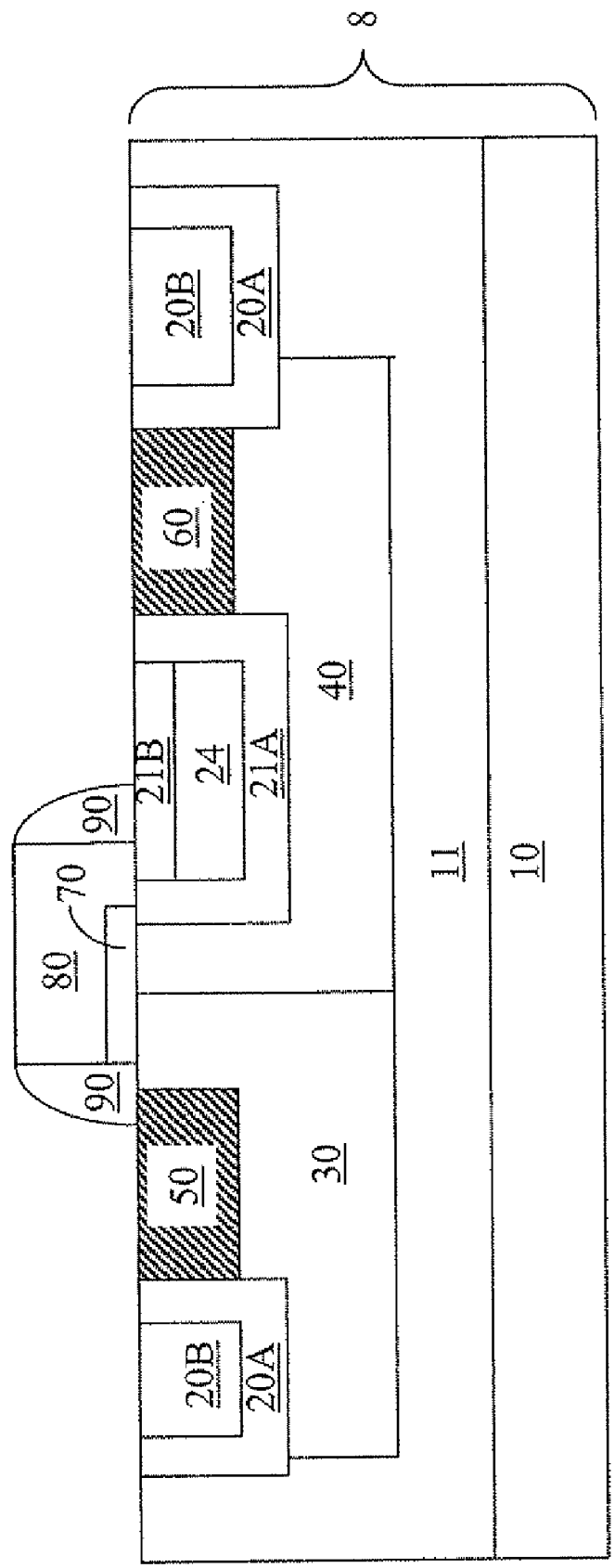

Referring to FIG. 22, a gate spacer 90 comprising a dielectric material is formed on sidewalls of the gate electrode 80. Dopants of the second conductivity type are implanted into exposed portions of the body 30 and the drift region 40 employing the gate electrode 80 and the gate spacer 90 as implantation masks to form a source region 50 and a drain region 60 respectively. The source region 50 is self-aligned to an edge of the gate electrode 80 with an offset and the drain region 60 is self-aligned to an outer sidewall of the drift region dielectric 22, which is one of the at least one trench sidewall as in the first embodiment.

Figure 23:
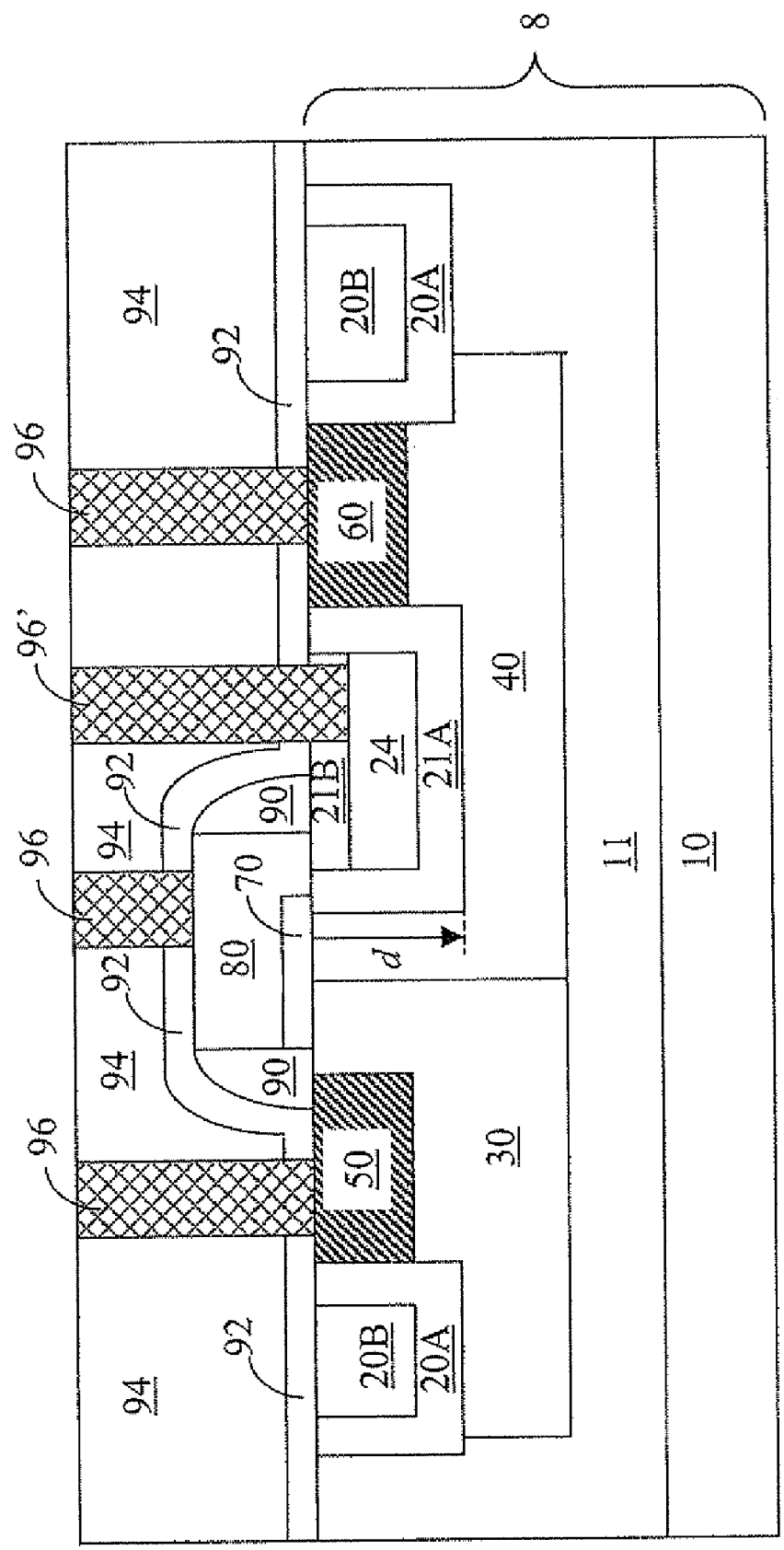

Referring to FIG. 23, conventional middle-of-line (MOL) structures are formed to provide electrical contact to the second exemplary semiconductor structure as in the first embodiment. Contact holes are etched in the MOL dielectric layer and filled with a conductive material such as metal to form contact vias 96 to the source region 50, the drain region 60, and the gate electrode 80. Although not shown, the body region 30 may be contacted in a similar fashion, for example by extending the body region 30 laterally beyond the shallow trench isolation region 20 and forming a contact in that region. The substrate layer 10 may be independently biased as necessary. In addition, another contact via 96' is formed on the field plate 24. The field plate 24 is thus independently biased to advantageously alter device characteristics of the inventive LDMOSFET. In one variation, the field plate 24 may be electrically connected to the gate electrode 80 via a metal wiring (not shown).

Figure 24:
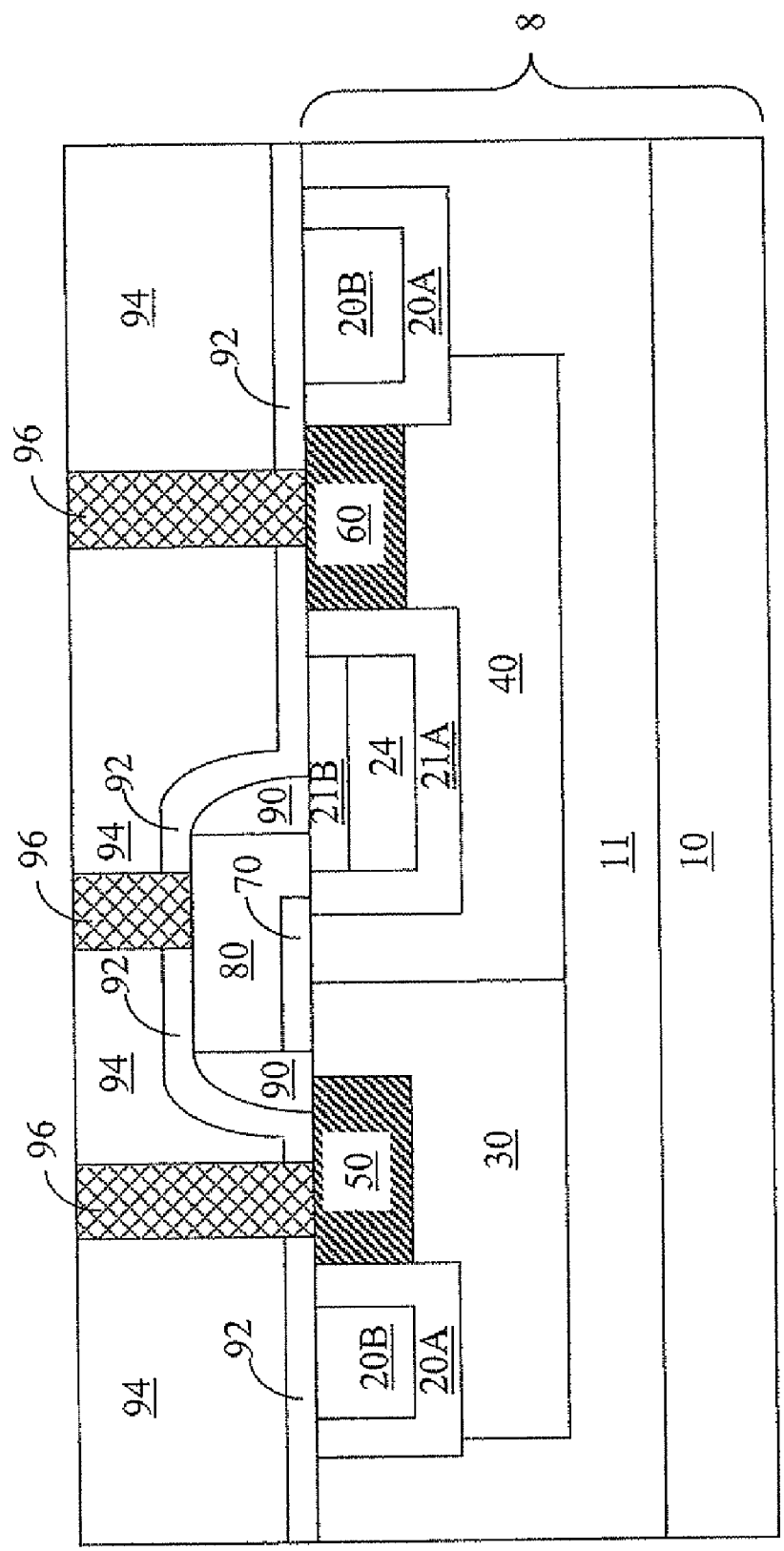
FIG. 24 is a vertical cross-sectional view of a variation of the second exemplary semiconductor structure.

Referring to FIG. 24, another variation on the second exemplary semiconductor structure is shown, in which the field plate 24 is not contacted by a contact via. Thus, the field plate 24 floats electrically without an externally applied direct bias. However, the field plate 24 is capacitively coupled to the gate electrode 80 via the field plate cap 21B. Thus, the potential of the field plate 24 changes in the same direction as the potential of the gate electrode 80, i.e., rises when a high voltage is applied to the gate electrode 80 and falls when a low voltage is applied to the gate electrode 80. These changes in the potential of the field plate 24 has advantageous effects of attracting charge carriers near the drift region dielectric 21A and increasing the conductivity of the drift region 40 in an on-state, while depleting charge carriers from near the field plate 24 in an off-state. Thus, the breakdown voltage of the junction between the body 30 and drift region 40 increases in the off-state, while on-resistance decreases for the inventive LDMOSFET.

Figure 25:
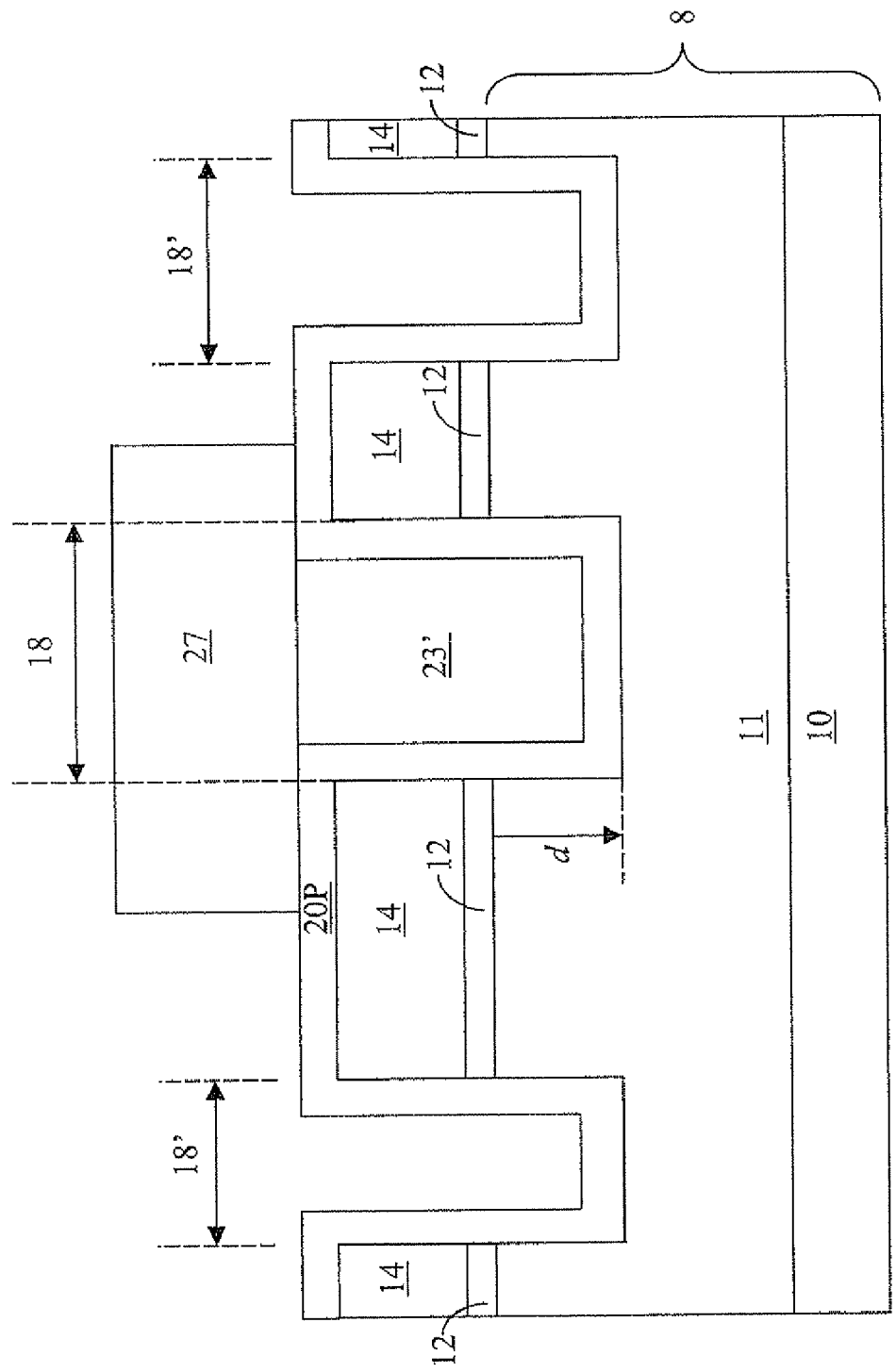
FIGS. 25-28 are sequential vertical cross-sectional views of a third exemplary semiconductor structure according to a third embodiment of the present invention.

Referring to FIG. 25, a third exemplary semiconductor structure according to a third embodiment of the present invention is derived from the second exemplary semiconductor structure of FIG. 15 by planarizing, for example, by chemical mechanical polishing (CMP), the conductive material layer 23 to a level that is substantially flush with top surfaces of the first dielectric material layer 20P. A block level photoresist 27 is applied and lithographically patterned to cover the shallow trench 18, while exposing the at least another shallow trench 18'.

A reactive ion etch or a wet etch may be employed to remove the conductive material layer 23 within the at least another shallow trench 18', while the portion of the conductive material layer 23 within the shallow trench 8 is protected by the block level photoresist 27. The block level photoresist 27 is subsequently removed.

Figure 26:
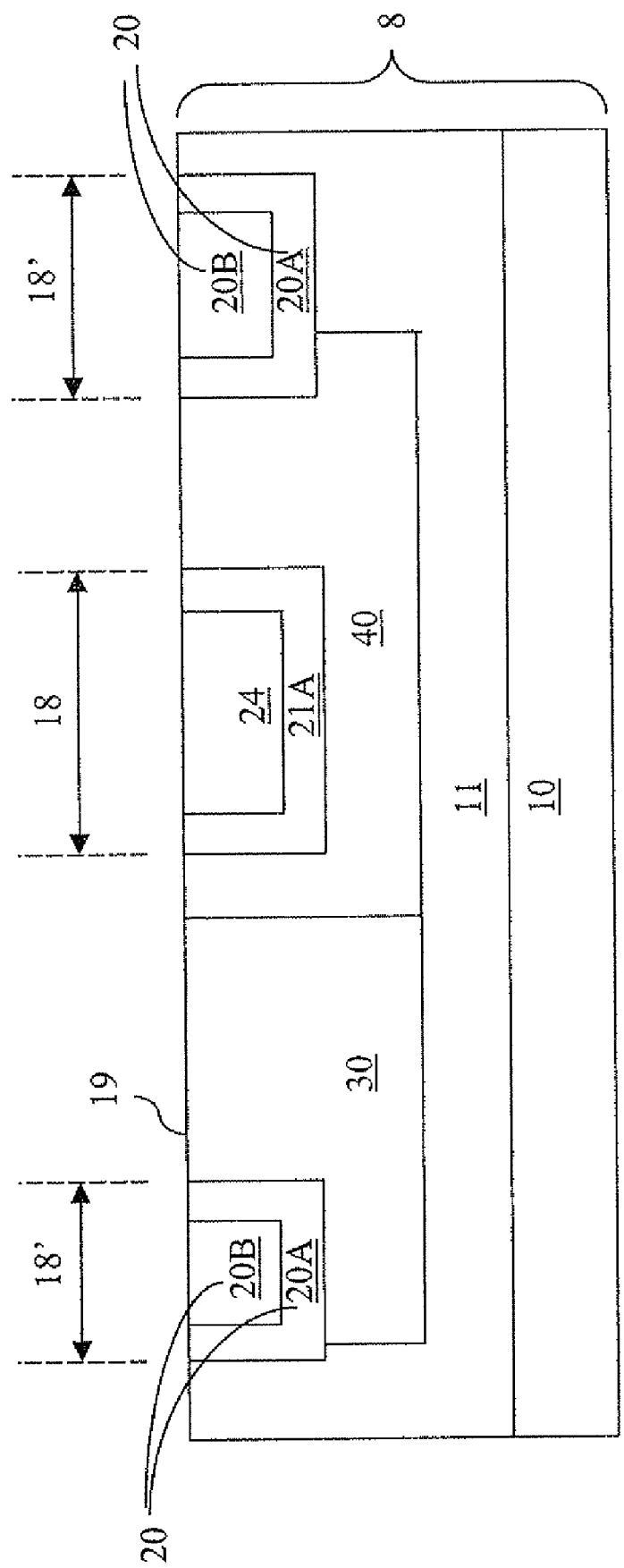

Referring to FIG. 26, a second dielectric material layer (not shown) is formed on the first dielectric material layer 20P and the conductive material portion 23' that is substantially flush with top surfaces of the first dielectric layer 20P and located in the shallow trench 18. The second dielectric material layer may comprise the same dielectric material the second dielectric material layer 20Q in the second embodiment. The at least another shallow trench 18' is filled with the first dielectric material layer 20P and the second dielectric material layer. The third exemplary semiconductor structure is planarized down to the substrate top surface 19, for example, by another planarization down to the top surfaces of the masking layer 14 (See FIG. 25), a recess etch of the first dielectric material layer 20P and the second dielectric material layer 20Q in the at least another shallow trench 18', and/or another recess etch of the conductive material portion 23'.

The remaining portion of the first dielectric material layer 20P within the shallow trench 18 constitutes a drift region dielectric 21A. The remaining portion of the conductive material portion 23' after the planarization is herein referred to as an embedded conductive material portion 24, which is embedded in the drift region dielectric 21A and has a top surface that is substantially flush with the substrate top surface 19.

The remaining portions of the first dielectric material layer 20P within the at least another shallow trench 18' constitute first shallow trench isolation (STI) dielectric portions 20A. The remaining portions of the second dielectric material layer within the at least another shallow trench 18' constitute second shallow trench isolation (STI) dielectric portions 20B. The first STI dielectric portions 20A and the second STI dielectric portions 20B collectively comprise shallow trench isolation 20.

A body 30 having a doping of the first conductivity type and a drift region 40 having a doping of the second conductivity type area are formed as in the first and second embodiments.

Figure 27:
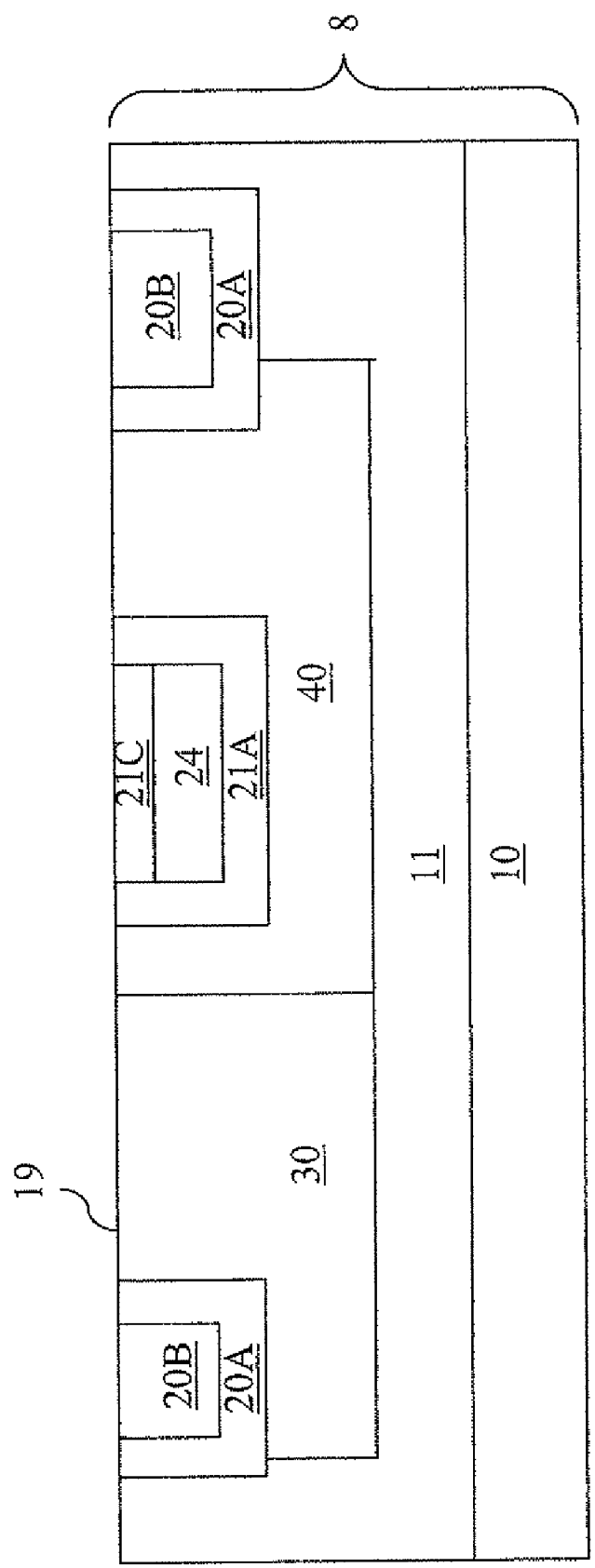

Referring to FIG. 27, a field plate cap 21C is formed on the embedded conductive material portion 24. The field plate cap 21C may comprise a dielectric material formed by chemical vapor deposition (CVD), or alternatively, may comprise a thermal silicon oxide formed by thermal conversion of the embedded conductive material portion 23", which, in this case, comprises silicon. Optionally, the embedded conductive material portion 23" may be recessed prior to deposition of the field plate cap 21C or thermal conversion of a portion of the embedded conductive material portion 23" so that a top surface of the field plate cap is substantially flush with the substrate top surface 19. The remaining conductive material in the remaining portion of the embedded conductive material portion 23" constitutes a field plate 24.

In case the field plate cap 21C is formed by deposition of a dielectric material by CVD, the field plate cap 21C may have a thickness from about 10 nm to about 100 nm, and preferably from about 10 nm to about 30 nm, although lesser and greater thicknesses are explicitly contemplated herein. In this case, the entirety of the embedded conductive material portion 23" constitutes the field plate 24. In case the field plate cap 21C is formed by thermal conversion of the portion of the embedded conductive material portion 23", the field plate cap 21C may have a thickness from about 1 nm to about 100 nm, and preferably from about 1 nm to about 30 nm, although lesser and greater thicknesses are explicitly contemplated herein. In this case, the remaining portion of the embedded conductive material portion 23" after the thermal conversion constitutes the field plate 24.

Figure 28:
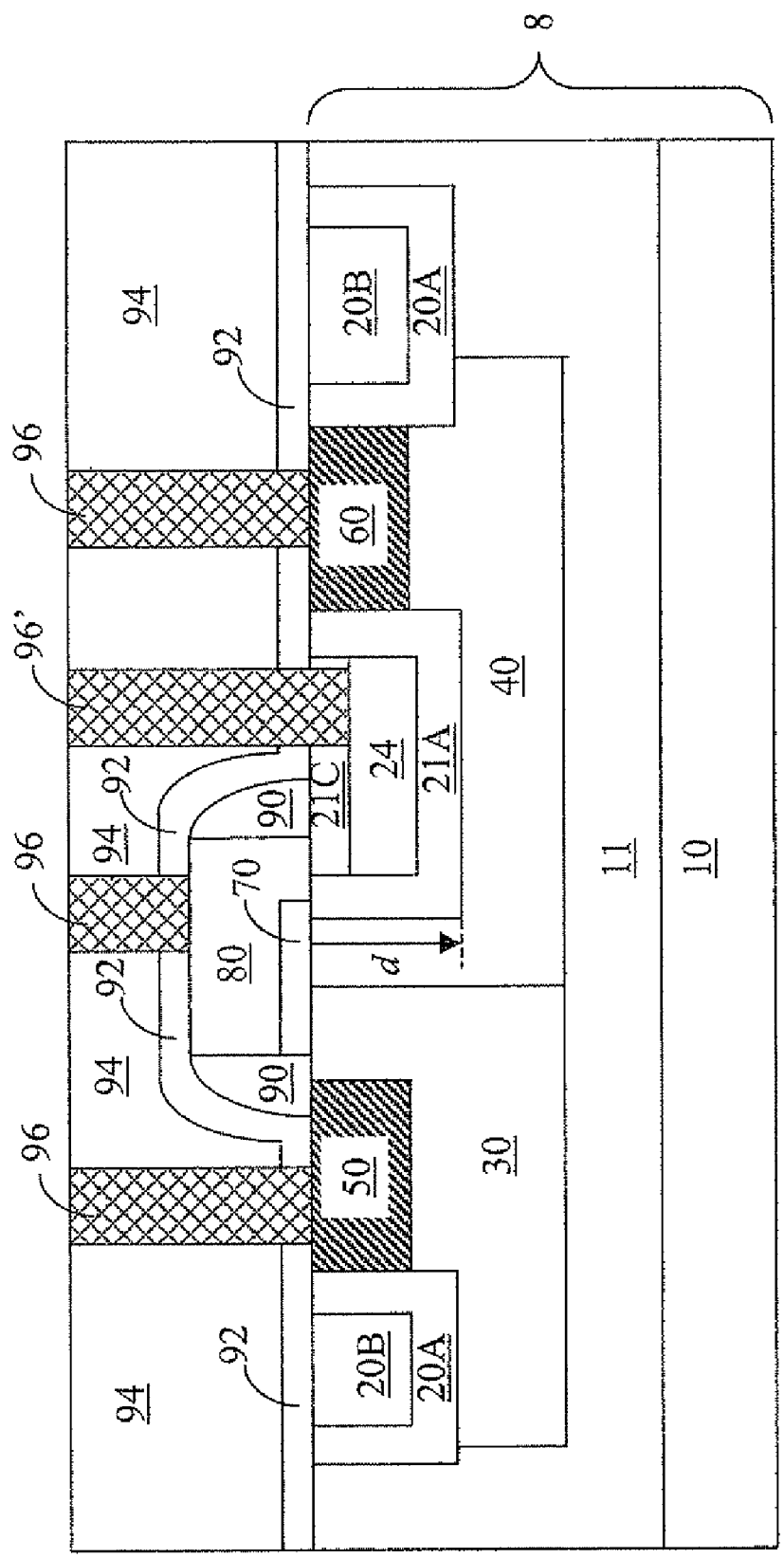

Referring to FIG. 28, conventional middle-of-line (MOL) structures are formed to provide electrical contact to the third exemplary semiconductor structure as in the first and second embodiments. Contact holes are etched in the MOL dielectric layer and filled with a conductive material such as metal to form contact vias 96 to the source region 50, the drain region 60, and the gate electrode 80. Although not shown, the body region 30 may be contacted in a similar fashion, for example by extending the body region 30 laterally beyond the shallow trench isolation region 20 and forming a contact in that region. The substrate layer 10 may be independently biased as necessary. In addition, another contact via 96' is formed on the field plate 24. The field plate 24 is thus independently biased to advantageously alter device characteristics of the inventive LDMSFET. In one variation, the field plate 24 may be electrically connected to the gate electrode 80 via a metal wiring (not shown).

Figure 29:
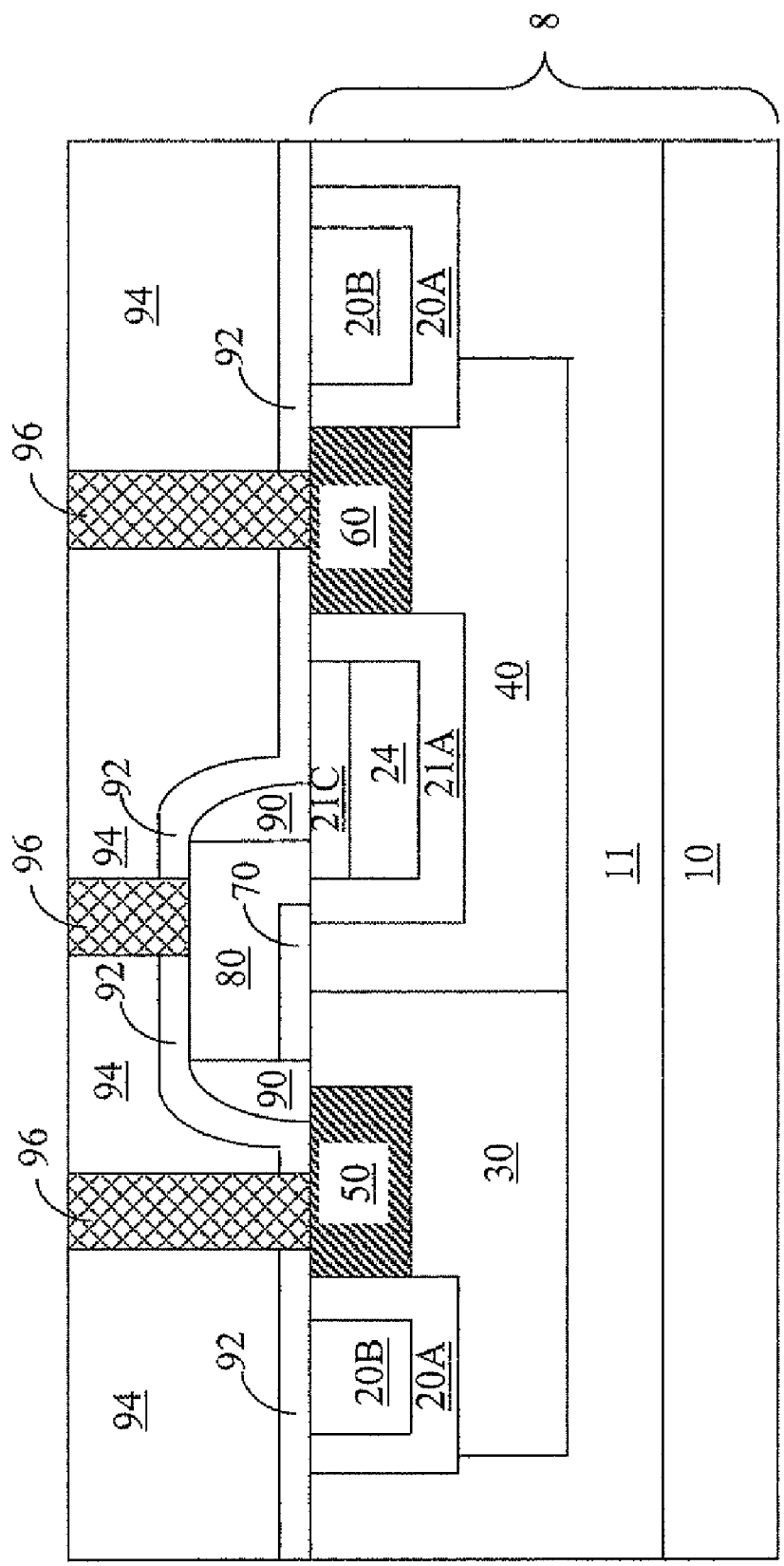
FIG. 29 is a vertical cross-sectional view of a variation of the third exemplary semiconductor structure.

Referring to FIG. 29, another variation on the third exemplary semiconductor structure is shown, in which the field plate 24 is not contacted by a contact via. Thus, the field plate 24 floats electrically without an externally applied direct bias, and is capacitively coupled to the gate electrode 80 via the field plate cap 21C as in one of the variations of the second embodiment. Thus, the breakdown voltage of the junction between the body 30 and drift region 40 increases in the off-state, while on-resistance decreases for the inventive as in the second embodiment.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a trench located in a semiconductor substrate and containing at least one trench sidewall and a trench bottom surface;
   a body having a doping of a first conductivity type and located in said semiconductor substrate and not contacting said trench;
   a drift region having a doping of a second conductivity type throughout and physically contacting said at least one sidewall and said trench bottom surface, wherein said second conductivity type is the opposite of said first conductivity type;
   a drift region dielectric of unitary construction comprising a dielectric material, located directly on and inside of said trench, and containing a bottom dielectric portion vertically abutting said trench bottom surface and a sidewall dielectric portion laterally abutting said at least on trench sidewall;
   a gate electrode abutting a gate dielectric, wherein said drift region, said body, and said drift region dielectric contact an entirety of a bottom surface of said gate dielectric;
   a gate electrode abutting a gate dielectric; and a field plate located within said trench, vertically abutting said bottom dielectric portion, and disjoined from said gate electrode.

2. The semiconductor structure of claim 1, further comprising a field plate cap comprising a dielectric material and abutting said gate electrode and said field plate.

3. The semiconductor structure of claim 2, wherein a top surface of said field plate cap is substantially coplanar with a top surface of said semiconductor substrate.

4. The semiconductor structure of claim 2, further comprising a shallow trench isolation dielectric portion embedded in said semiconductor substrate, wherein said shallow trench isolation dielectric portion comprises a same material as said dielectric material of said field plate cap.

5. The semiconductor structure of claim 1, further comprising a contact via vertically abutting said field plate and electrically isolated from said gate electrode.

6. The semiconductor structure of claim 1, wherein said field plate is electrically floating and is capacitively coupled to said gate electrode.

7. The semiconductor structure of claim 1, further comprising:
    a source region having a doping of said second conductivity type, located in said semiconductor substrate, abutting said body, and disjoined from said drift region; and
    a drain region having a doping of said second conductivity type, located in said semiconductor substrate, abutting said drift region, and disjoined from said body.

8. The semiconductor structure of claim 7, wherein said drift region and drain region contacts all of said at least one sidewall of said trench and said trench bottom surface.

9. The semiconductor structure of claim 7, wherein said field plate is electrically isolated from said source region, and is electrically biased independent of an electrical bias to said gate electrode.

10. The semiconductor structure of claim 7, wherein said field plate is electrically isolated from said source region, and is electrically connected to said gate electrode.

11. The semiconductor structure of claim 1, wherein said drift region and a drain region contacts an entirety of sidewalls of said trench and an entirety of said trench bottom surface.

12. The semiconductor structure of claim 1, wherein said trench extends from a surface of said semiconductor substrate to a depth, and a vertical distance between a topmost surface of said drift region and a bottommost surface of said drift region exceeds said depth.

13. The semiconductor structure of claim 1, further comprising a tub region having a doping of said second conductivity type and contacting an entirety of a bottommost surface of said drift region and an entirety of a bottommost surface of said body.

14. The semiconductor structure of claim 1, further comprising a contact via comprising a conductive material and contacting said field plate, wherein said contact via extends from above said semiconductor substrate through a top surface of said semiconductor substrate to a top surface of said field plate.

* * * * *